United States Patent
Yaoi et al.

(10) Patent No.: US 7,102,941 B2
(45) Date of Patent: Sep. 5, 2006

(54) SEMICONDUCTOR MEMORY DEVICE AND PORTABLE ELECTRONIC APPARATUS

(75) Inventors: Yoshifumi Yaoi, Yamatokoriyama (JP); Hiroshi Iwata, Nara (JP); Akihide Shibata, Nara (JP); Masaru Nawaki, Nara (JP); Yasuaki Iwase, Tenri (JP); Yoshinao Morikawa, Ikoma (JP)

(73) Assignee: Sharp Kabushiki Kaisha, Osaka (JP)

( * ) Notice: Subject to any disclaimer, the term of this patent is extended or adjusted under 35 U.S.C. 154(b) by 219 days.

(21) Appl. No.: 10/847,625

(22) Filed: May 18, 2004

(65) Prior Publication Data

US 2004/0233719 A1 Nov. 25, 2004

(30) Foreign Application Priority Data

May 19, 2003 (JP) .............................. 2003-140904

(51) Int. Cl.
*G11C 29/00* (2006.01)
*G11C 7/00* (2006.01)

(52) U.S. Cl. ............ 365/200; 365/185.09; 365/185.11; 365/185.13; 365/230.06

(58) Field of Classification Search ................ 365/200, 365/185.09, 185.11, 185.13, 230.06
See application file for complete search history.

(56) References Cited

U.S. PATENT DOCUMENTS

| | | | |
|---|---|---|---|
| 5,621,690 A | | 4/1997 | Jungroth et al. |
| 6,144,591 A | * | 11/2000 | Vlasenko et al. ............ 365/200 |
| 6,262,926 B1 | * | 7/2001 | Nakai ......................... 365/200 |
| 6,331,956 B1 | * | 12/2001 | Ooishi et al. ............... 365/200 |
| 6,868,008 B1 | * | 3/2005 | Kamei et al. .......... 365/185.09 |

FOREIGN PATENT DOCUMENTS

| | | |
|---|---|---|
| JP | 5-81072 B2 | 11/1993 |
| JP | 5-304277 A | 11/1993 |
| JP | 9-116119 A | 5/1997 |
| JP | 2001-156188 A | 6/2001 |
| JP | 2001-156189 A | 6/2001 |
| JP | 2001-230332 A | 8/2001 |
| JP | 2002-190535 A | 7/2002 |

* cited by examiner

*Primary Examiner*—Richard Elms
*Assistant Examiner*—Toan Le
(74) *Attorney, Agent, or Firm*—Birch, Stewart, Kolasch & Birch, LLP

(57) ABSTRACT

A semiconductor memory device including (A) a global line; (B) a memory array having (i) a local line, (ii) a decoder connected to the global line and the local line, and (iii) a memory block and a redundant block each constructed by a plurality of memory cells each having a gate electrode formed on a semiconductor layer via a gate insulating film, a channel region disposed below the gate electrode, a diffusion region disposed on both sides of the channel region and having a conductive type opposite to that of the channel region, and a memory functional unit formed on both sides of the gate electrode and having the function of retaining charges, the memory array having the function that when the decoder is usable, the global line is selectively connected to one of the local lines in accordance with address information and, when a defective block is included in the memory blocks and the decoder is unusable, the local line is separated from the global line and the defective block is replaced with the redundant block; and (C) a circuit for making the decoder of the defective block unusable and, only when the defective block is addressed, for making the decoder of the redundant block usable.

26 Claims, 18 Drawing Sheets

US 7,102,941 B2

SEMICONDUCTOR MEMORY DEVICE AND PORTABLE ELECTRONIC APPARATUS

CROSS-REFERENCE TO RELATED APPLICATION

This application is related to Japanese application No. 2003-140904 filed on May 19, 2003, whose priority is claimed under 35 USC §119, the disclosure of which is incorporated by reference in its entirety.

BACKGROUND OF THE INVENTION

1. Field of the Invention

The present invention relates to a semiconductor memory device and a portable electronic apparatus. More particularly, the present invention relates to an electrically erasable and writable semiconductor memory device including a decoder for a memory block and a decoder for a redundant block capable of replacing a defective block found in a memory array with a redundant block without exerting an influence on the other blocks, and to a portable electronic apparatus having the semiconductor memory device.

2. Description of the Related Art

Conventionally, a flash memory is typically used as a nonvolatile memory.

In a flash memory, as shown in FIG. 27, a floating gate 902, an insulating film 907 and a word line (control gate) 903 are formed in this order on a semiconductor substrate 901 via a gate insulating film. On both sides of the floating gate 902, a source line 904 and a bit line 905 are formed by a diffusion region, thereby constructing a memory cell. A device isolation region 906 is formed around the memory cell (see, for example, Japanese Unexamined Patent Publication No. HEI 5(1993)-304277).

The memory cell retains data according to the more or less a charge amount in the floating gate 902. In a memory cell array constructed by arranging the memory cells, an operation of rewriting/reading a desired memory cell can be performed, by selecting a specific word line and a specific bit line and applying a predetermined voltage.

In such a flash memory, when a charge amount in the floating gate changes, a drain current (Id)-gate voltage (Vg) characteristic as shown in FIG. 28 is displayed. When the amount of negative charges in the floating gate increases, the threshold increases, and an Id-Vg curve shifts almost in parallel in the direction of increasing Vg.

In such a flash memory, however, it is necessary to dispose the insulating film 907 for separating the floating gate 902 from the word line 903 from the functional viewpoint. In addition, it is difficult to reduce the thickness of the gate insulating film in order to prevent leakage of charges from the floating gate 902. It is therefore difficult to effectively reduce the thickness of the insulating film 907 and the gate insulating film, and it disturbs reduction in size of the memory cell.

SUMMARY OF THE INVENTION

The present invention has been achieved in consideration of the problems and in its various embodiments provides a semiconductor memory device and a portable electronic apparatus capable of realizing high operating speed and reliability while achieving reduction in size.

According to an aspect of the present invention, it is provided a semiconductor memory device comprising:

(A) a global line;
(B) a memory array having
  (i) a local line,
  (ii) a decoder connected to the global line and the local line, and
  (iii) a memory block and a redundant block each constructed by a plurality of memory cells each having a gate electrode formed on a semiconductor layer via a gate insulating film, a channel region disposed below the gate electrode, a diffusion region disposed on both sides of the channel region and having a conductive type opposite to that of the channel region, and a memory functional unit formed on both sides of the gate electrode and having the function of retaining charges,
the memory array having the function that when the decoder is usable, the global line is selectively connected to one of the local lines in accordance with address information, and when a defective block is included in the memory blocks and the decoder is unusable, the local line is separated from the global line and the defective block is replaced with the redundant block; and
(C) a circuit for making the decoder of the defective block unusable and, only when the defective block is addressed, for making the decoder of the redundant block usable.

According to another aspect of the present invention, it is provided a semiconductor memory device comprising:

(A) a plurality of global lines each selected in accordance with an address;
(B) a memory array having
  (i) a plurality of local lines,
  (ii) a plurality of selection transistors for connecting one of the global lines to one of the local lines in accordance with a block selection signal, and
  (iii) a memory block and a redundant block each constructed by a plurality of memory cells each having a gate electrode formed on a semiconductor layer via a gate insulating film, a channel region disposed below the gate electrode, a diffusion region disposed on both sides of the channel region and having a conductive type opposite to that of the channel region, and a memory functional unit formed on both sides of the gate electrode and having the function of retaining charges,
the memory array having the function that the redundant block is replaced with a defective memory block; and
(C) a circuit for making the selection transistor in the defective block unusable and, only when the defective block is addressed, for making the selection transistor in the redundant block usable.

According to still another aspect of the present invention, it is provided a semiconductor memory device comprising:

(A) a global line;
(B) a memory array having
  (i) a plurality of local lines,
  (ii) a local decoder connected to the global line and the local lines, and
  (iii) a memory block and a redundant block each constructed by a plurality of memory cells each having a gate electrode formed on a semiconductor layer via a gate insulating film, a channel region disposed below the gate electrode, a diffusion region disposed on both sides of the channel region and having a conductive type opposite to that of the channel region, and a memory functional unit formed on both sides of the gate electrode and having the function of retaining charges, the memory array having the function that when the local decoder is enabled to be used by a block selection signal, the local decoder decodes an address for connecting a local line selected from the local lines to the global line, and when one of the memory blocks is defective and the local decoder is unusable, the local line is separated from the global line and the defective block is replaced with the redundant block; and (C) a circuit for making the local decoder of the defective block unusable and, only when the defective block is addressed, for making the local decoder of the redundant block usable.

According to the semiconductor memory device of mbodimentse of the present invention, by employing the configurations as described above, a defective block can be replaced with a redundant block without acting and exerting an influence on the global line.

Each of the memory cells constructing the memory block and the redundant block has a gate electrode formed on a semiconductor layer via a gate insulating film, a channel region disposed below the gate electrode, a diffusion region disposed on both sides of the channel region and having a conductive type opposite to that of the channel region, and a memory functional unit formed on both sides of the gate electrode and having the function of retaining charges. Consequently, a memory function of the memory functional unit and a transistor operation function of the gate insulating film are separated from each other. Thus, while maintaining the sufficient memory function, the thickness of the gate insulating film is reduced, and the short channel effect is suppressed. Further, a value of current flowing between the diffusion layers changes largely due to rewriting as compared with the case of rewriting in an EEPROM, so that it facilitates discrimination between the writing state and the erasing state of the semiconductor memory device. Thus, the packing density of the semiconductor memory device is increased and the operating speed is increased.

These and other features of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE INVENTION

Figure 1:
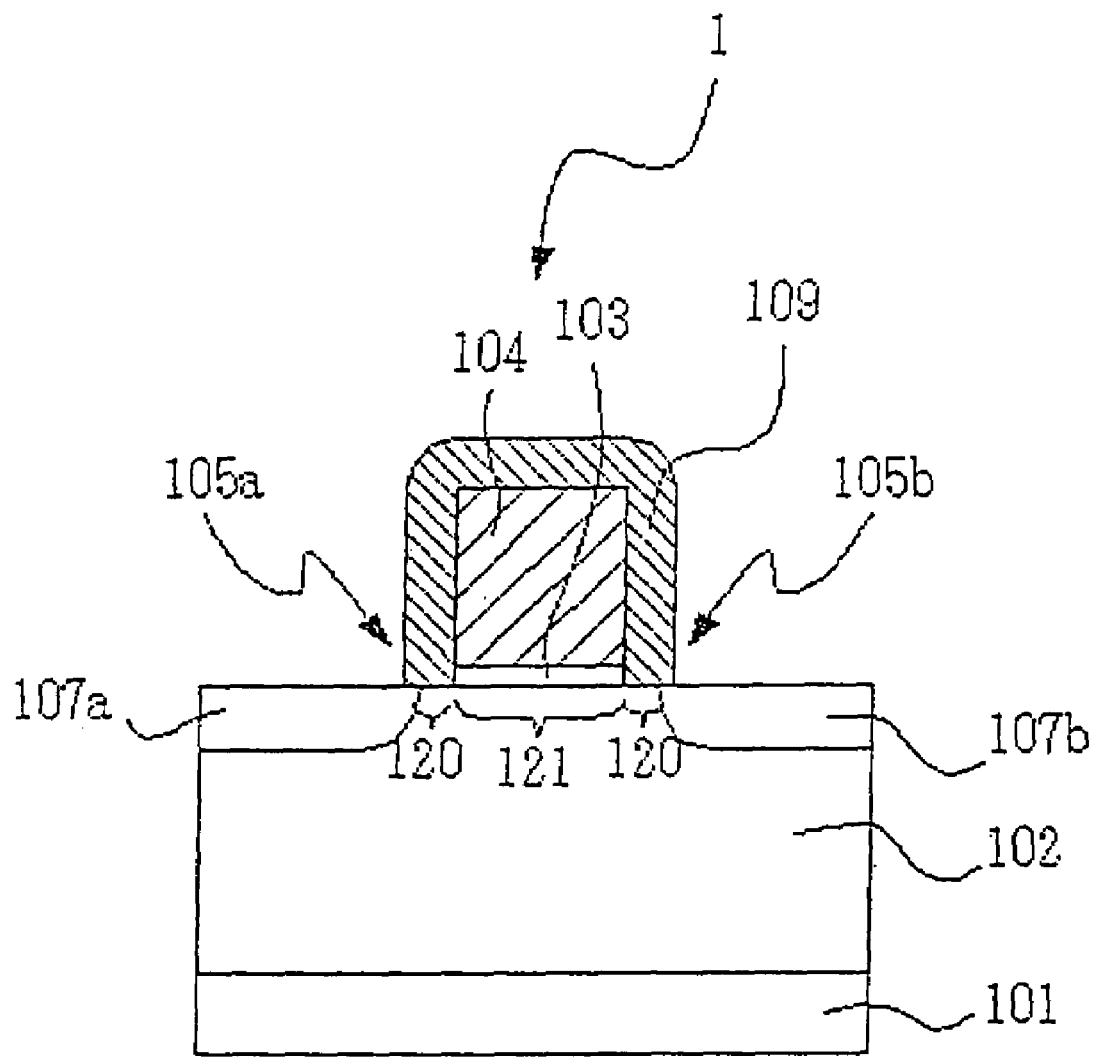
FIG. 1 is a schematic sectional view of a principal portion of a memory cell constituted a semiconductor memory device of the present invention (First Embodiment)

Main components of a semiconductor memory device acording to embodiments of the present invention comprise a global line, a memory array and a specific circuit. The memory array may be constructed by a local line, a decoder and a redundant decoder or a selection transistor, and a memory block and a redundant block each constructed by memory cells. Preferably, the semiconductor memory device of embodiments of the present invention basically employs an MOS circuit and all of circuits including the MOS circuit are mounted on a single semiconductor substrate.

The memory cell constituted the semiconductor memory device of an embodiments of the present invention is mainly constructed by a semiconductor layer, a gate insulating film, a gate electrode, a channel region, a diffusion region and a memory functional unit. Herein, the channel region is normally a region of the same conductive type as that of the semiconductor layer and denotes a region below the gate electrode. The diffusion region denotes a region of the conductive type opposite to that of the channel region.

Concretely, the memory cell of embodiments of the present invention may be constructed by a region of a first conductive type as the diffusion region, a region of a second conductive type as the channel region, the memory functional unit disposed across a border of the regions of the first and second conductive types, and an electrode provided via the gate insulating film or a insulating film. It is suitable that the memory cell of an embodiments of the present invention is constructed by the gate electrode formed on the gate insulating film, two memory functional units formed on both sides of the gate electrode, two diffusion regions disposed on the opposite sides of the gate electrode of the memory functional units, and a channel region disposed below the gate electrode.

In the semiconductor device of an embodiments of the present invention, the semiconductor layer is formed on the semiconductor substrate as the semiconductor layer, preferably, on a well region of the first conductive type formed in the semiconductor substrate.

The semiconductor substrate is not particularly limited as long as it can be used for a semiconductor device, and an example thereof includes a bulk substrate made of an element semiconductor such as silicon, germanium or the like or a compound semiconductor such as silicon germanium, GaAs, InGaAs, ZnSe or GaN. As a substrate having a semiconductor layer on its surface, various substrates such as an SOI (Silicon on Insulator) substrate, an SOS (Silicon on Sapphire) substrate and a multilayer SOI substrate, or a glass or plastic substrate having thereon a semiconductor layer may be used. In particular, a silicon substrate and an SOI substrate having a semiconductor layer on its surface are preferable. The semiconductor substrate or semiconductor layer may be single crystal (formed by, for example, epitaxial growth), polycrystal, or amorphous although the more or less of an amount of current flowing therein varies.

On the semiconductor layer, preferably, a device isolation region is formed. Further, a single layer or multilayer structure may be formed by a combination of devices such as a transistor, a capacitor and a resistor, a circuit formed by the devices, a semiconductor device, and an interlayer insulating film. The device isolation region can be formed by any of various device isolation films such as an LOCOS film, a trench oxide film and an STI film. The semiconductor layer may be of the P or N conductive type. In the semiconductor layer, preferably, at least one well region of the first conductive type (P or N type) is formed. Impurity concentration which is within a known range in this field can be used as impurity concentration in the semiconductor layer and the well region. In the case of using the SOI substrate as the semiconductor layer, the well region may be formed in the surface semiconductor layer and a body region may be provided below the channel region.

The gate insulating film or the insulating film is not particularly limited as long as it is usually used for a semiconductor device, and examples thereof include a single-layer film or a laminated film of an insulating film such as a silicon oxide film or a silicon nitride film, or a high dielectric constant film such as an aluminum oxide film, a titanium oxide film, a tantalum oxide film or a hafnium oxide film. Particularly, a silicon oxide film is preferable. The gate insulating film has a thickness of, for example, about 1 to 20 nm, preferably, about 1 to 6 nm. The gate insulating film may be formed only immediately below the gate electrode or formed so as to be larger (wider) than the gate electrode.

The gate electrode or the electrode is formed in a shape which is usually used for a semiconductor device or a shape having a recess in a lower end portion on the gate insulating film. The gate electrode is preferably formed in an integral form. The gate electrode formed in the integral form means that the gate electrode comprised a single-layered or multilayer conductive film is not separated and formed in an integral form. The gate electrode may have a side-wall insulating film on its sidewalls. Usually, the gate electrode is not particularly limited as long as it is used for a semiconductor device, and examples of thereof includes a conductive film, for example, a single-layered or multilayer film made of polysilicon, a metal such as copper or aluminum, a high-refractory metal such as tungsten, titanium or tantalum, and a silicide with the high refractory metal. Suitable thickness of the gate electrode is, for example, about 50 to 400 nm. Below the gate electrode, a channel region is formed.

In other words, the memory functional unit contains a film (hereinafter, described as "charge retaining function film") or a region had the function of retaining charges, the function of accumulating and retaining charges, the function of trapping charges or the function of holding a charge polarization state. Examples of elements having the above function include: silicon nitride; silicon; a silicate glass including impurity such as phosphorus or boron; silicon carbide; alumina; a high dielectric material such as hafnium oxide, zirconium oxide or tantalum oxide; zinc oxide; ferroelectric; metals, and the like. Therefore, the memory functional unit can be formed by, for example, a single-layered or laminated structure of: an insulating film including a silicon nitride film; an insulating film having therein a conductive film or a semiconductor layer; an insulating film including at least one conductor or semiconductor dot; or an insulating film including a ferroelectric film of which inner charge is polarized by an electric field and in which the polarized state is held. Particularly, the silicon nitride film is preferable for the reason that the silicon nitride film can obtain a large hysteretic characteristic since a number of levels of trapping charges exist. In addition, the charge retention time is long and a problem of charge leakage due to occurrence of a leak path does not occur, so that the retention characteristics are good. Further, silicon nitride is a material which is used as standard in an LSI process.

Reliability of storage and retention can be increased by using the insulating film including a film having the charge retaining function such as a silicon nitride film as the memory functional unit. Since the silicon nitride film is an insulator, even in the case where a charge leak occurs in part of the silicon nitride film, the charges in the whole silicon nitride film are not lost immediately. In the case of arranging a plurality of memory cells, even when the distance between the memory cells is shortened and neighboring memory functional units come into contact with each other, unlike the case where the memory functional units are made of conductors, information stored in the memory functional units is not lost. Further, a contact plug can be disposed closer to the memory functional unit. In some cases, the contact plug can be disposed so as to be overlapped with the memory functional unit. Thus, reduction in size of the memory cell is facilitated.

The film having the charge retaining function does not always have to have a film shape in order to increase the reliability of storage and retention. Preferably, films having the charge retaining function exist discretely in an insulating film. Concretely, it is preferable that the materials having the charge retaining function in the shape of dots be spread in a material which is hard to retain charges, for example, in a silicon oxide.

It is preferable to use the insulating film having therein the conductive film or semiconductor layer as a memory functional unit for the reason that an amount of injecting charges into the conductor or semiconductor can be freely controlled and multilevel values can be easily obtained.

Further, it is preferable to use the insulating film including at least one conductor or semiconductor dot as the memory functional unit for the reason that it becomes easier to perform writing and erasing by direct tunneling of charges, and reduction in power consumption can be achieved.

Alternately, as a memory functional unit, a ferroelectric film such as PZT or PLZT in which the polarization direction changes according to the electric field may be used. In this case, charges are substantially generated in the surface of the ferroelectric film by the polarization and are held in that state. It is therefore preferable since the ferroelectric film can obtain a hysteresis characteristic similar to that of a film to which charges are supplied from the outside of the film having the memory function and which traps charges. In addition, it is unnecessary to inject charges from the outside of the film in order to retain charges in the ferroelectric film, and the hysteresis characteristic can be obtained only by the polarization of the charge in the film, so that writing/erasing can be performed at high speed.

As the insulating film constructing the memory functional unit, a film having a region or function of suppressing escape of charges is suitable. An example of the film having the function of suppressing escape of charges includes a silicon oxide film.

The charge retaining film included in the memory functional unit is disposed on both sides of the gate electrode directly or via an insulating film, and is disposed on the semiconductor layer (semiconductor substrate, well region, body region or source/drain region, or diffusion region) directly or via a gate insulating film. Preferably, the charge retaining film on both sides of the gate electrode is formed so as to cover all or part of the sidewalls of the gate electrode directly or via the insulating film. In an application example, in the case where the gate electrode has a recess in its lower end, the charge retaining film may be formed so as to completely or partially bury the recess directly or via an insulating film.

Preferably, the gate electrode is formed only on the sidewalls of the memory functional unit as described later or does not cover the top part of the memory functional unit. By such arrangement, a contact plug can be disposed closer to the gate electrode, so that reduction in the size of the memory cell is facilitated. It is easy to manufacture the memory cell having such simple arrangement, so that the yield in production can be improved.

In the case of using a conductive film or a semiconductor layer as the charge retaining film, preferably, the conductive film is disposed via an insulating film so that the charge retaining film is not in direct contact with the semiconductor layer (semiconductor substrate, well region, body region, source/drain regions or diffusion region) or a gate electrode. For example, a laminated structure of the conductive film and the insulating film, a structure in which conductive films in the form of dots are spread in the insulating film, a structure in which the conductive film is disposed in a part of a sidewall insulating film formed on sidewalls of the gate, and the like can be mentioned.

The diffusion regions can function as source and drain regions and have the conductive type opposite to that of the semiconductor layer or well region. In the junction, preferably, difference between impurity concentrations of the diffusion regions and the semiconductor layer or well region is high for the reason that hot electrons or hot holes are generated efficiently with low voltage, and high-speed operation can be performed with lower voltage. The junction depth of the diffusion regions is not particularly limited but can be appropriately adjusted in accordance with the performance or the like of a semiconductor memory device to be obtained. In the case of using an SOI substrate as a semiconductor substrate, the diffusion regions may have a junction depth smaller than the thickness of the surface semiconductor layer. It is preferable that the diffusion region has junction depth almost the same as that of the surface semiconductor layer.

One side or both sides of the diffusion regions may be disposed so as to overlap with an end of the gate electrode, so as to match an end of the gate electrode, or so as to be offset from an end of the gate electrode. The case of offset is particularly preferable because easiness of inversion of the offset region below the charge retaining film largely changes in accordance with an amount of charges accumulated in the memory functional unit when voltage is applied to the gate electrode, the memory effect increases, and a short channel effect is reduced. However, when the diffusion region is offset too much, drive current between the diffusion regions (source and drain) decreases conspicuously. Therefore, it is preferable that the offset amount, that is, the distance to the source/drain regions closer to one of the gate electrode ends in the gate length direction is shorter than the thickness of the charge retaining film extending in the direction parallel with the gate length direction. It is particularly important that at least a part of the film or region having the charge retaining function in the memory functional unit is overlapped with part of the diffusion regions. This is because the essence of the memory cell as a component of the semiconductor memory device is to rewrite stored information by an electric field which is applied across the memory functional unit in accordance with the voltage difference between the gate electrode which exists only in the sidewall part of the memory functional unit and the diffusion regions.

A part of the diffusion regions may extend at a level higher than the surface of the channel region or the under face of the gate insulating film. In this case, it is suitable that, on the diffusion regions formed in the semiconductor substrate, the conductive film integrated with the diffusion regions are laminated. The conductive film may be made of semiconductor such as polysilicon or amorphous silicon, silicide, the above-described metals, high-refractory metals, or the like. In particular, polysilicon is preferred. Since impurity diffusion speed of polysilicon is much faster than that of the semiconductor layer, it is easy to make the junction depth of the diffusion regions in the semiconductor layer shallow and to suppress the short channel effect. In this case, preferably, a part of the diffusion regions are disposed so as to sandwich at least a part of the memory functional unit in cooperation with the gate electrode.

The memory cell of the present invention can be formed by a normal semiconductor process, for example, a method similar to the method of forming the sidewall spacer having the single-layer or laminated structure on the sidewalls of the gate electrode. Concrete examples of the method include; a method of forming the gate electrode or the electrode, after that, forming a single-layer film or laminated film including the charge retaining film such as a charge retaining film, charge retaining film/insulating film, insulating film/charge retaining film, or insulating film/charge retaining film/insulating film, and etching back the formed film under suitable conditions so as to leave the films in a sidewall spacer shape; a method of forming an insulating film or charge retaining film, etching back the film under suitable conditions so as to leave the film in the sidewall spacer shape, further forming the charge retaining film or insulating film, and similarly etching back the film so as to leave the film in the sidewall spacer shape; a method of applying or depositing an insulating film material in which particles made of a charge retaining material are spread on the semiconductor layer including the gate electrode and etching back the material under suitable conditions so as to leave the insulating film material in a sidewall spacer shape; and a method of forming a gate electrode, after that, forming the single-layer film or laminated film, and patterning the film with a mask. According to another method, before the gate electrode or the electrode is formed, charge retaining film, charge retaining film/insulating film, insulating film/ charge retaining film, insulating film/charge retaining film/ insulating film, or the like is formed. An opening is formed in a region which becomes the channel region of these films, a gate electrode material film is formed on the entire surface of the opening, and the gate electrode material film is patterned in a shape including the opening and larger than the opening, thereby forming the gate electrode and the memory functional unit.

There will be explained one example of a method for forming the memory device of an embodiments of the present invention. First, a gate insulating film and a gate electrode are formed on a semiconductor substrate by a known procedure. Next, on the entire surface of the semiconductor substrate, a silicon oxide film with a thickness of 0.8 to 20 nm, more preferably 3 to 10 nm, is formed by thermal oxidation or deposited by CVD (Chemical Vapor Deposition). Then, a silicon nitride film with a thickness of 2 to 15 nm, more preferably 3 to 10 nm, is deposited by CVD on the entire surface of the silicon oxide film. In turn, a silicon oxide film with a thickness of 20 to 70 nm is deposited on the entire surface of the silicon nitride film.

Subsequently, the silicon oxide film/silicon nitride film/ silicon oxide film is etched back by anisotropic etching, so that memory functional units, most suitable for storage, are provided in the form of memory device side-wall spacers on the side walls of the gate electrode.

Then, diffusion regions (source/drain regions) are formed by ion implantation using as masks the gate electrode and the memory functional units in the form of memory device side-wall spacers. Thereafter, a silicidation process and an upper-wiring installation process are carried by a known procedure to provide a memory element.

In the case of constructing the memory cell array by arranging memory cells of embodiments of the present invention, a best mode of the memory cell satisfies all of the requirements: for example, (1) the gate electrodes of a plurality of memory cells are integrated and have the function of a word line; (2) the memory functional units are formed on both sides of the word line; (3) an insulator, particularly, a silicon nitride film retains charges in the memory functional unit; (4) the memory functional unit is constructed by an ONO (Oxide Nitride Oxide) film and the silicon nitride film has a surface almost parallel with the surface of the gate insulating film; (5) a silicon nitride film in the memory functional unit is isolated from a word line and a channel region via a silicon oxide film; (6) the region having the function of retaining charge (example, region having the silicon nitride film) and a diffusion region in the memory functional unit are overlapped; (7) the thickness of the insulating film separating the silicon nitride film having the surface which is almost parallel with the surface of the gate insulating film from the channel region or semiconductor layer and the thickness of the gate insulating film are different from each other; (8) an operation of writing/erasing one memory cell is performed by a single word line; (9) there is no electrode (word line) having the function of assisting the writing/erasing operation on the memory functional unit; and (10) in a portion in contact with the diffusion region immediately below the memory functional unit, a region of high concentration of impurity whose conductive type is opposite to that of the diffusion region is provided. other useful embodiments of the invention are provided even when fewer than all the foregoing requirements are satisfied. It may be sufficient for the memory cell to satisfy even one of the requirements.

In the case where the memory cell satisfies at least the requirements (3) and (9), it is very useful for the following reasons.

First, the bit line contact can be disposed closer to the memory functional unit on the word line sidewall or even when the distance between memory cells is shortened, a plurality of memory functional units do not interfere with each other, and stored information can be held. Therefore, reduction in size of the memory cell is facilitated. In the case where the charge retaining region in the memory functional unit is made of a conductor, as the distance between memory cells decreases, interference occurs between the charge retaining regions due to capacitive coupling, so that stored information cannot be held.

In the case where the charge retaining region in the memory functional unit is made of an insulator (for example, a silicon nitride film), it becomes unnecessary to make the memory functional unit independent for each memory cell. For example, the memory functional units formed on both sides of a single word line shared by a plurality of memory cells do not have to be isolated for each memory cell. The memory functional units formed on both sides of one word line can be shared by a plurality of memory cells sharing the word line. Consequently, a photo and etching process for isolating the memory functional unit becomes unnecessary, and the manufacturing process is simplified. Further, a margin for positioning in the photolithography process and a margin for film reduction by etching become unnecessary, so that the margin between neighboring memory cells can be reduced. Therefore, as compared with the case where the charge retaining region in the memory functional unit is made of a conductor (for example, polysilicon film), even when the memory functional unit is formed at the same microfabrication level, a memory cell occupied area can be reduced. In the case where the charge retaining region in the memory functional unit is made of a conductor, the photo and etching process for isolating the memory functional unit for each memory cell is necessary, and a margin for positioning in the photolithography process and a margin for film reduction by etching are necessary.

Moreover, since the electrode having the function of assisting the writing and erasing operations does not exist on the memory functional unit and the device structure is simple, the number of processes decreases, so that the yield in production can be increased. Therefore, it facilitates formation with a transistor as a component of a logic circuit or an analog circuit, and a cheap semiconductor memory device can be obtained.

Additional benefits provided by embodiments of the present invention that satisfy requirements (6) in addition to requirements (3) and (9).

Specifically, writing and erasing can be performed with a very low voltage by overlapping the charge retaining region in the memory functional unit and the diffusion region. Concretely, with a low voltage of 5 V or less, the writing and erasing operations can be performed. The action is a very large effect also from the viewpoint of circuit designing. Since it is unnecessary to generate a high voltage in a chip unlike a flash memory, a charge pumping circuit requiring a large occupation area can be omitted or its scale can be reduced. Particularly, when a memory of small-scale capacity is provided for adjustment in a logic LSI, as for an occupied area in a memory part, an occupation area of peripheral circuits for driving a memory cell is dominant more than that of a memory cell. Consequently, omission or down sizing of the charge pumping circuit for a memory cell is most effective to reduce the chip size.

On the other hand, in the case where the requirement (3) is not satisfied, that is, in the case where a conductor retains charges in the memory functional unit, even when the requirement (6) is not satisfied, specifically, even when the conductor in the memory functional unit and the diffusion region do not overlap with each other, writing operation can be performed at high speed. This is because that the conductor in the memory functional unit assists writing operation by capacitive coupling with the gate electrode.

In the case where the requirement (9) is not satisfied, specifically, in the case where the electrode having the function of assisting the writing and erasing operations exists on the memory functional unit, even when the requirement (6) is not satisfied, specifically, even when the insulator in the memory functional unit and the diffusion region do not overlap with each other, writing operation can be performed at high speed.

In short, in the case where the requirement (3) or (9) is not satisfied, even when the requirement (6) is not satisfied, writing operation can be performed at high speed. Not satisfying the requirement (3) or (9), however, causes increase in the occupation area of a memory cell. As clear from the above, it is often beneficial to satisfy the requirements (3), (6) and (9) at the same time.

In the semiconductor memory device of embodiments of the present invention, a transistor may be connected in series with one of or both sides of a memory cell, or the memory cell may be mounted on the same chip with a logic transistor. A selection transistor may be connected in one of or both sides of a memory block having the memory cell. In such a case, the semiconductor device of an embodiments of the present invention, particularly, the memory cell can be formed by a process having high compatibility with a process of forming a normal standard transistor such as a transistor or a logic transistor, they can be formed simultaneously. Therefore, a process of forming both the memory cell and a transistor or a logic transistor is very simple and, as a result, a cheap embedded device can be obtained.

In the semiconductor memory device of an embodiments of the present invention, a global line and a local line are included. The global and local lines include, for example, a global word line or a line extending on the outside of a memory array and connected to the memory array, such as a global word line and/or a local bit line or a line in the memory array, such as a local bit line.

Further, in the semiconductor memory device of an embodiments of the present invention, as a circuit expressed by (C), any circuit can be used as long as it can realize the function of making a decoder of a defective block unusable and making a decoder of a redundant block usable only when the defective block is addressed. For example, the circuit may be a Y decoder, an X decoder, a Y gating circuit, a global X decoder, a block decoder, a CAM, a comparison logic or the like, or a combination of one kind or two or more kinds of any of the circuits or circuits corresponding to the circuits.

In the semiconductor memory device of an emobdiments the present invention, a memory cell can store two or more values per one memory functional unit, so that it can function as a memory cell for storing information of four or more values. The memory cell may store only binary information. In each of the memory cells of a memory array 31, 1-bit data or multi-bit data can be stored each time. For example, the memory array 31 can store data of 8 megabits. The capacity of the memory array 31 may be smaller or larger than 8 megabits. The memory cell can also function as a memory cell having both the function of a selection transistor and the function of a memory transistor by a variable resistance effect produced by the memory functional units.

In the semiconductor memory device of an embodiments the present invention, the memory cell can store information of two or more values in one memory functional unit. Thus, the memory cell can function as a memory cell for storing information of four or more values. The memory cell may store binary data only. The memory cell is also allowed to function as a memory cell having the functions of both a selection transistor and a memory transistor by a variable resistance effect of the memory functional unit.

The semiconductor memory device of embodiments of the present invention can be widely applied by being combined with a logic device, a logic circuit or the like to: a data processing system such as a personal computer, a note-sized computer, a laptop computer, a personal assistant/transmitter, a mini computer, a workstation, a main frame, a multi-processor/computer, a computer system of any other type, or the like; an electronic part as a component of the data processing system, such as a CPU, a memory or a data memory device; a communication apparatus such as a telephone, a PHS, a modem or a router; an image display apparatus such as a display panel or a projector; an office apparatus such as a printer, a scanner or a copier; an image pickup apparatus such as a video camera or a digital camera; an entertainment apparatus such as a game machine or a music player; an information apparatus such as a portable information terminal, a watch or an electronic dictionary; a vehicle-mounted apparatus such as a car navigation system or a car audio system; an AV apparatus for recording/ reproducing information such as a motion picture, a still picture or music; an appliance such as a washing machine, a microwave, a refrigerator, a rice cooker, a dish washer, a vacuum cleaner or an air conditioner; a health managing apparatus such as a massage device, a bathroom scale or a manometer; and a portable memory device such as an IC card or a memory card. Particularly, it is effective to apply the semiconductor memory device to portable electronic apparatuses such as portable telephone, portable information terminal, IC card, memory card, portable computer, portable game machine, digital camera, portable motion picture player, portable music player, electronic dictionary and watch. The semiconductor memory device of embodiments of the present invention may be provided as at least a part of a control circuit or a data storing circuit of an electronic device or, as necessary, detachably assembled.

Hereinafter, embodiments of the semiconductor memory device, the display device and the portable electronic apparatus of embodiments of the present invention will be described in detail with reference to the drawings.

FIRST EMBODIMENT

A semiconductor memory device of a first embodiment has a memory cell 1 as shown in FIG. 1.

The memory cell 1 has a gate electrode 104 formed on a P-type well region 102 formed on the surface of a semiconductor substrate 101 via a gate insulating film 103. On the top face and side faces of the gate electrode 104, a silicon nitride film 109 having a trap level of retaining charges and serving as a charge retaining film is disposed. In the silicon nitride film 109, parts of both sidewalls of the gate electrode 104 serve as memory functional units 105a and 105b for actually retaining charges. The memory functional unit refers to a part in which charges are actually accumulated by rewriting operation in the memory functional unit or the charge retaining film. In the P-type well region 102 on both sides of the gate electrode 104, N-type diffusion regions 107a and 107b functioning as a source region and a drain region, respectively, are formed. Each of the diffusion regions 107a and 107b has an offset structure. Specifically, the diffusion regions 107a and 107b do not reach a region 121 below the gate electrode 104, and offset regions 120 below the charge retaining film construct part of the channel region.

Figure 2A:
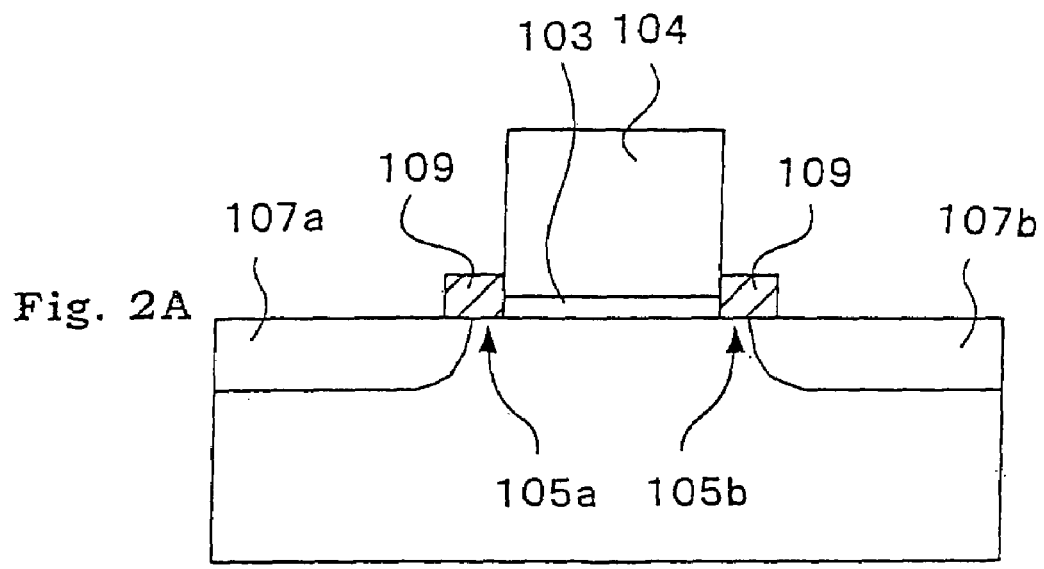
FIGS. 2A and 2B are schematic sectional views of principal portions of another memory cells constituted semiconductor memory devices of the present invention (First Embodiment)
Figure 2B:
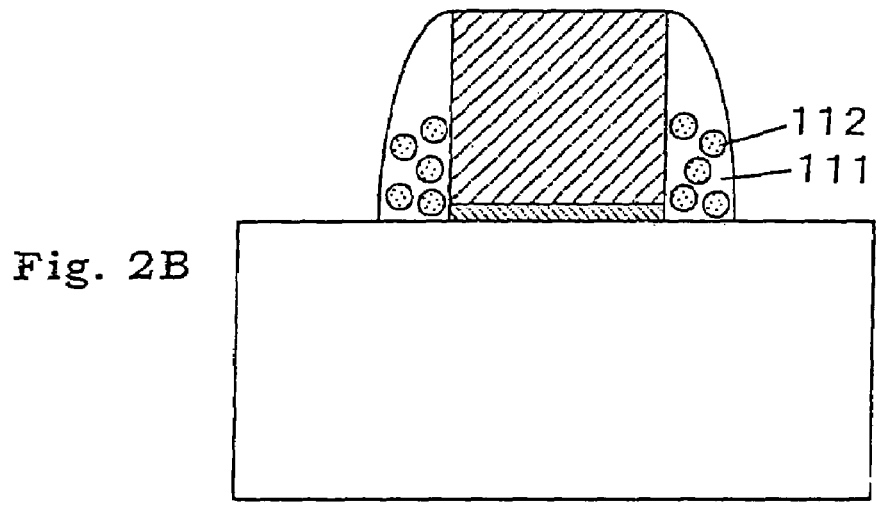

The memory functional units 105a and 105b for substantially retaining charges are the parts on both sidewalls of the gate electrode 104. It is therefore sufficient that the silicon nitride film 109 is formed only in regions corresponding to the parts (see FIG. 2A). Each of the memory functional units 105a and 105b may have a structure in which fine particles 112 each made of a conductor or semiconductor and having a nanometer size are distributed like discrete points in an insulating film 111 (see FIG. 2B). When the fine particle 112 has a size less than 1 nm, a quantum effect is too large, so that it becomes hard for charges to go(tunnel) to the dots. When the size exceeds 10 nm, a conspicuous quantum effect does not appear at room temperature. Therefore, the diameter of the fine particle 111 is preferably in a range from 1 nm to 10 nm. The silicon nitride film 109 serving as a charge retaining film may be formed in a sidewall spacer shape on a side face of the gate electrode (see FIG. 3).

The principle of the writing operation of the memory cell will be described with reference to FIGS. 3 and 4. The case where whole memory functional units 131a and 131b have the function of retaining charges will be described.

"Writing" denotes herein injection of electrons into the memory functional units 131a and 131b when the memory cell is of the N channel type. Hereinafter, on assumption that the memory cell is of the N channel type, description will be given.

Figure 3:
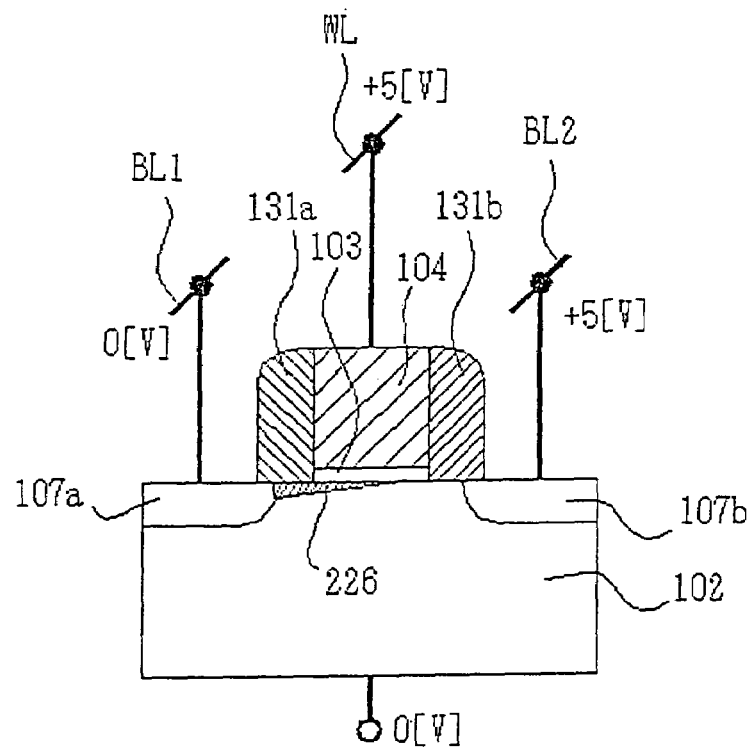
FIGS. 3 and 4 are views for illustrating writing operations of memory cells constituted semiconductor memory devices of the present invention (First Embodiment)

As shown in FIG. 3, the first diffusion region 107a of the N type is set as a source electrode, and the second diffusion region 107b of the N type is set as a drain electrode, in order to inject electrons (write) the second memory functional unit 131b. For example, 0 V is applied to the first diffusion region 107a and the P-type well region 102, +5 V is applied to the second diffusion region 107b, and +5 V is applied to the gate electrode 104. Under such voltage parameters, an inversion layer 226 extends from the first diffusion region 107a (source electrode) but does not reach the second diffusion region 107b (drain electrode), and a pinch off point occurs. Electrons are accelerated from the pinch-off point to the second diffusion region 107b (drain electrode) by a high electric field, and become so-called hot electrons (high-energy conduction electrons). Writing is performed by injection of the hot electrons into the second memory functional unit 131b. Since hot electrons are not generated in the vicinity of the first memory functional unit 131a, writing is not performed.

As aforesaid, by injecting electrons into the second memory functional unit 131b, writing is performed.

Figure 4:
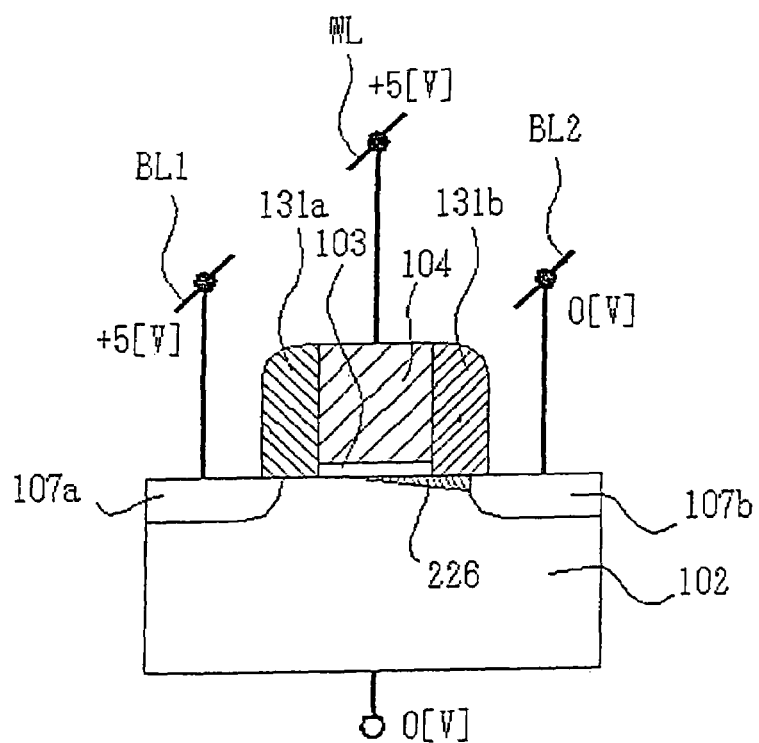

On the other hand, as shown in FIG. 4, the second diffusion region 107a is set as the source electrode, and the first diffusion region 107a is set as the drain electrode, in order to inject electrons (write) into the first memory functional unit 131a. For example, 0 V is applied to the second diffusion region 107b and the P-type well region 102, +5 V is applied to the first diffusion region 107a, and +5 V is applied to the gate electrode 104. Electrons are injected into the first memory functional unit 131a and writing can be performed by interchanging the source and drain regions so as to be different from the case of injecting electrons into the second memory functional unit 131b.

The principle of erasing operation of the memory cell will now be described with reference to FIGS. 5 and 6.

Figure 5:
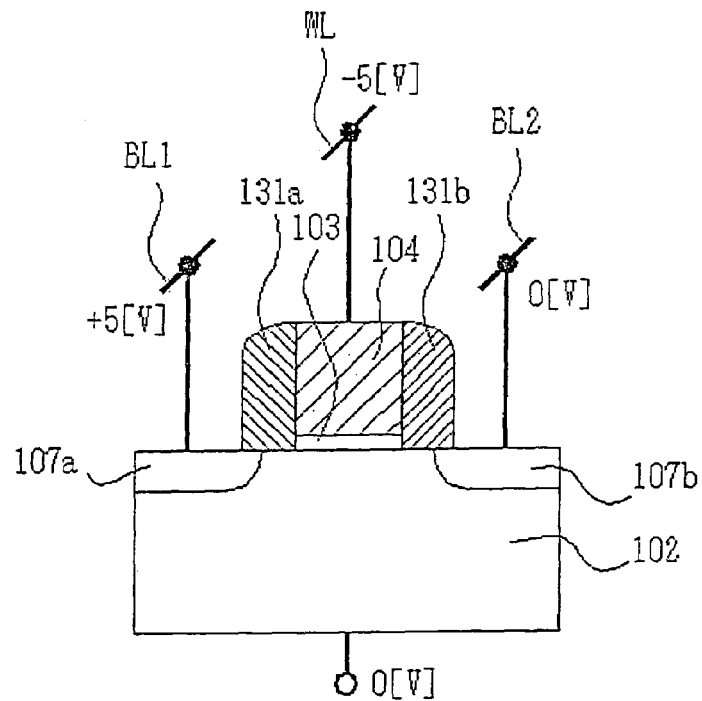
FIGS. 5 and 6 are views for illustrating erasing operations of memory cells constituted semiconductor memory devices of the present invention (First Embodiment)

In a first method of erasing information stored in the first memory functional unit 131a, the PN junction between the first diffusion region 107a and the P-type well region 102 is reverse-biased and, further, negative voltage (for example, −5 V) is applied to the gate electrode 104, by applying positive voltage (for example, +5 V) to the first diffusion region 107a and applying 0 V to the P-type well region 102 as shown in FIG. 5. At this time, in the vicinity of the gate electrode 104 in the PN junction, due to the influence of the gate electrode to which the negative voltage is applied, particularly, gradient of potential becomes sharp. Consequently, hot holes (positive holes of high energy) are generated on the side of the P-type well region 102 of the PN junction by interband tunneling. The hot holes are attracted toward the gate electrode 104 having a negative potential and, as a result, the holes are injected to the first memory functional unit 131a. In such a manner, information in the first memory functional unit 131a is erased. At this time, to the second diffusion region 107b, it is sufficient to apply 0 V.

In the case of erasing information stored in the second memory functional unit 131b, the above-described operation is performed while interchanging the potential of the first diffusion region and that of the second diffusion region.

Figure 6:
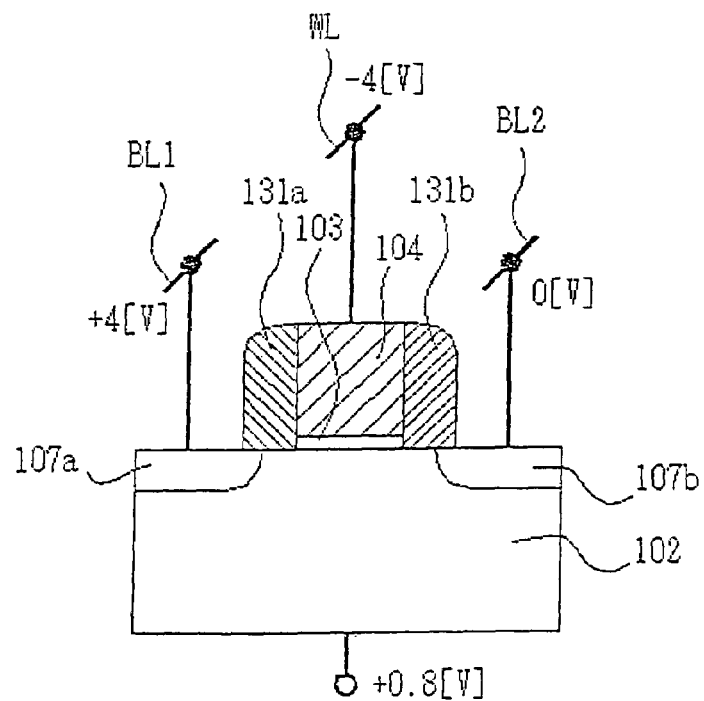

In a second method of erasing information stored in the first memory functional unit 131a, as shown in FIG. 6, positive voltage (for example, +4 V) is applied to the first diffusion region 107a, 0 V is applied to the second diffusion region 107b, negative voltage (for example, −4 V) is applied to the gate electrode 104, and positive voltage (for example, +0.8 V) is applied to the P-type well region 102. At this time, forward voltage is applied between the P-type well region 102 and the second diffusion region 107b, and electrons are injected to the P-type well region 102. The injected electrons are diffused to the PN junction between the P-type well region 102 and the first diffusion region 107a, where the electrons are accelerated by a strong electric field, thereby becoming hot electrons. By the hot electrons, an electron-hole pair is generated in the PN junction. Specifically, electrons injected in the P-type well region 102 become a trigger, and hot holes are generated in the PN junction positioned on the opposite side by applying forward voltage between the P-type well region 102 and the second diffusion region 107b. The hot holes generated in the PN junction are attracted toward the gate electrode 104 having the negative potential and, as a result, positive holes are injected into the first memory functional unit 131a.

According to the method, also in the case where only voltage insufficient to generate hot holes by interband tunneling is applied to the PN junction between the P-type well region and the first diffusion region 107a, electrons injected from the second diffusion region 107b become a trigger to generate an electron-positive hole pair in the PN junction, thereby enabling hot holes to be generated. Therefore, voltage in the erasing operation can be decreased. Particularly, in the case where the offset region 120 (see FIG. 1) exists, an effect that the PN junction becomes sharp by the gate electrode to which the negative potential is applied is low. Consequently, although it is difficult to generate hot holes by interband tunneling, by the second method, the disadvantage is overcome and the erasing operation can realized with low voltage.

In the case of erasing information stored in the first memory functional unit 131a, +5 V has to be applied to the first diffusion region 107a in the first erasing method whereas +4 V is sufficient in the second erasing method. As described above, according to the second method, the voltage at the time of erasing can be decreased, so that power consumption can be reduced and deterioration of the memory cell due to hot carriers can be suppressed.

In any of the erasing methods, over-erasure does not occur easily in the memory cell. The over-erasure herein denotes a phenomenon that as the amount of positive holes accumulated in the memory functional unit increases, the threshold decreases without saturation. The over-erasure is a big issue in an EEPROM typified by a flash memory. Particularly, in the case where the threshold becomes negative, critical malfunctioning that selection of a memory cell becomes impossible occurs. On the other hand, in the memory cell in the semiconductor memory device of embodiments of the present invention, also in the case where a large amount of positive holes are accumulated in the memory functional unit, only electrons are induced below the memory functional unit but an influence is hardly exerted to the potential in the channel region below the gate insulating film. Since the threshold at the time of erasing is determined by the potential below the gate insulating film, occurrence of over-erasure is suppressed.

Further, the principle of reading operation of the memory cell will be described with reference to FIG. 7.

Figure 7:
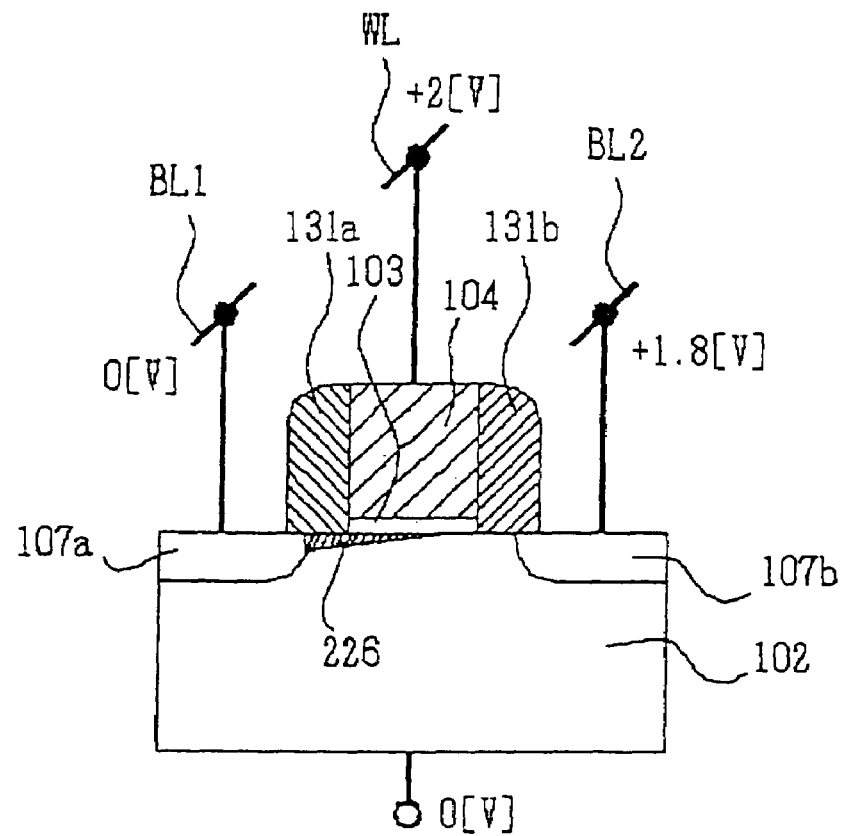
FIG. 7 is a view for illustrating a reading operation of a memory cell constituted a semiconductor memory device of the present invention (First Embodiment)

In the case of reading information stored in the first memory functional unit 131a as shown in FIG. 7, the first diffusion region 107a is set as a source electrode, the second diffusion region 107b is set as a drain electrode, and the transistor is allowed to operate in a saturated region. For example, 0 V is applied to the first diffusion region 107a and the P-type well region 102, +1.8 V is applied to the second diffusion region 107b, and +2 V is applied to the gate electrode 104. In the case where electrons are not accumulated in the first memory functional unit 131a at this time, drain current is apt to flow. On the other hand, in the case where electrons are accumulated in the first memory functional unit 131a, an inversion layer is not easily formed in the vicinity of the first memory functional unit 131a, so that the drain current is not apt to flow. Therefore, by detecting the drain current, information stored in the first memory functional unit 131a can be read. The presence/absence of charge accumulation in the second memory functional unit 131b does not exert an influence on the drain current since the pinch-off point occurs in the area in the vicinity of the drain.

In the case of reading information stored in the second memory functional unit 131b, the second diffusion region 107b is set as a source electrode, the first diffusion region 107a is set as a drain electrode, and the transistor is operated in a saturated region. It is sufficient to apply, for example, 0 V to the second diffusion region 107b and the P-type well region 102, +1.8 V to the first diffusion region 107a, and +2 V to the gate electrode 104. Information stored in the second memory functional unit 131b can be read by interchanging the source and drain regions of the case of reading information stored in the first memory functional unit 131a.

In the case where a channel region (offset region 120) which is not covered with the gate electrode 104 remains, in the channel region which is not covered with the gate electrode 104, an inversion layer is dissipated or formed according to the presence/absence of excessive charges in the memory functional units 131a and 131b and, as a result, large hysteresis (change in the threshold) is obtained. However, when the offset region 120 is too wide, the drain current largely decreases and reading speed becomes much slower. Therefore, it is preferable to determine the width of the offset region 120 so as to obtain sufficient hysteresis and reading speed.

Also in the case where the diffusion regions 107a and 107b reach ends of the gate electrode 104, that is, the diffusion regions 107a and 107b overlap with the gate electrode 104, the threshold of the transistor hardly changes by the writing operation. However, parasitic resistance at the source/drain ends largely changes, and the drain current largely decreases (by equal to or more than one digit). Therefore, reading can be performed by detecting the drain current, and the function as a memory can be obtained. In the case where a larger memory hysteresis effect is necessary, it is preferable that the diffusion regions 107a and 107b and the gate electrode 104 are not overlapped (offset region 120 exists).

By the above operating method, two bits can be written/erased selectively per one transistor. A memory cell array can be constructed by connecting a word line WL to the gate electrode 104 of the memory cell, connecting a first bit line BL1 to the first diffusion region 107a, connecting a second bit line BL2 to the second diffusion region 107b, and arranging memory cells.

In the above-described operating method, writing and erasing of two bits per one transistor are performed by interchanging the source electrode and the drain electrode. Alternately, the transistor may operate as a 1-bit memory by fixing the source electrode and the drain electrode. In this case, common fixed voltage can be applied to one of the source and drain regions, so that the number of bit lines connected to the source/drain regions can be reduced to the half.

As obvious from the above description, in the memory cell in the semiconductor memory device of the present invention, the memory functional unit is formed independently of the gate insulating film, and is formed on both sides of the gate electrode, so that 2-bit operation is possible. Since each memory functional unit is isolated by the gate electrode, interference at the time of rewriting is effectively suppressed. Further, since the gate insulating film is isolated from the memory functional unit, it can be formed thinly and a short channel effect can be suppressed. Therefore, reduction in size of the memory cell and, accordingly, the semiconductor memory device can be achieved easily.

SECOND EMBODIMENT

Figure 8:
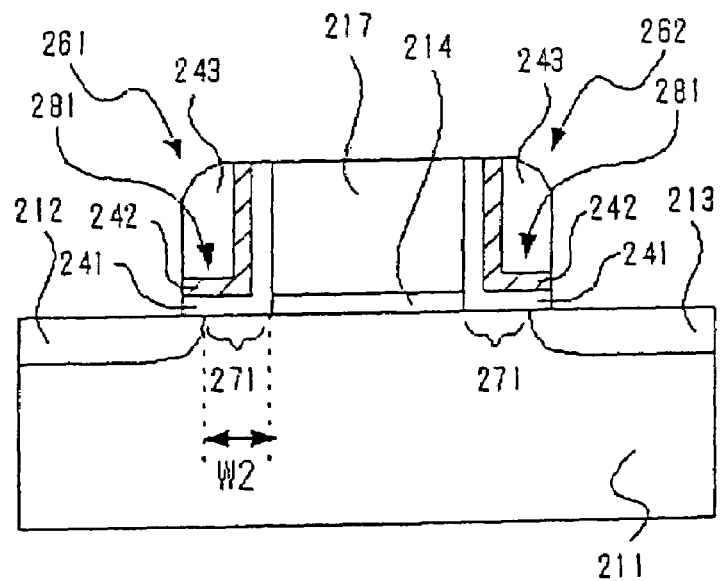
FIG. 8 is a schematic sectional view of a principal portion of a memory cell constituted a semiconductor memory device of the present invention (Second Embodiment)

A memory cell in a semiconductor memory device according to a second embodiment has a configuration substantially similar to that of the memory cell 1 of FIG. 1 except that, as shown in FIG. 8, each of memory functional units 261 and 262 is constructed by a charge retaining region (which is a charge accumulating region and may be a film having the function of retaining charges) and a region for suppressing escape of charges (or a film having the function of suppressing escape of charges).

From the viewpoint of improving a memory retention characteristic, preferably, the memory functional unit includes a charge retaining film having the function of retaining charges and an insulating film. In the second embodiment, a silicon nitride film 242 having a level of trapping charges is used as the charge retaining film, and silicon oxide films 241 and 243 having the function of preventing dissipation of charges accumulated in the charge retaining are used as insulating films. The memory functional unit includes the charge retaining film and the insulating films, thereby preventing dissipation of charges, and the retention characteristic can be improved. The volume of the charge retaining film can be appropriately reduced, movement of charges in the charge retaining film can be regulated, and occurrence of a characteristic change due to charge movement during retention of information can be suppressed, as compared with the case where the memory functional unit is constructed only by the charge retaining film. Further, charge injecting efficiency at the time of rewriting operation becomes high by employing the structure in which the silicon nitride film 242 is sandwiched by the silicon oxide films 241 and 243, so that higher-speed operation can be performed. In the memory cell, the silicon nitride film 242 may be replaced with a ferroelectric.

The regions for retaining charges (silicon nitride films 242) in the memory functional units 261 and 262 overlap with diffusion regions 212 and 213. The overlap denotes herein that at least a part of the region for retaining charges (silicon nitride film 242) exists over at least a part of the diffusion regions 212 and 213. A reference numeral 211 denotes a semiconductor substrate, a reference numeral 214 denotes a gate insulating film, a reference numeral 217 denotes a gate electrode, and a reference numeral 271 indicates an offset region between the gate electrode 217 and the diffusion regions 212 and 213. Although not shown, the surface of the semiconductor substrate 211 under the gate insulating film 214 serves as a channel region.

An effect obtained when the silicon nitride films 242 as regions for retaining charges in the memory functional units 261 and 262 overlap with the diffusion regions 212 and 213 will be described.

Figure 9:
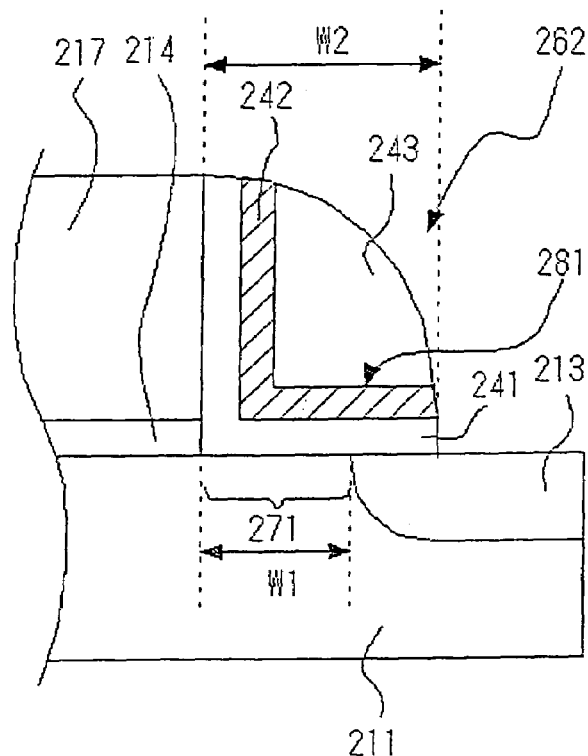
FIG. 9 is a schematic enlarged sectional view of a principal portion of a memory cell in FIG. 8.

As shown in FIG. 9, in an area around the memory functional unit 262, when an offset amount between the gate electrode 217 and the diffusion region 213 is W1 and the width of the memory functional unit 262 in a cross section in the channel length direction of the gate electrode is W2, the overlap amount between the memory functional unit 262 and the diffusion region 213 is expressed as W2−W1. It is important herein that the memory functional unit 262 constructed by the silicon oxide film 242 overlaps with the diffusion region 213, that is, the relation of W2>W1 is satisfied.

In FIG. 9, an end on the side apart from the gate electrode 217 of the silicon nitride film 242 in the memory functional unit 262 matches with the end of the memory functional unit 262 on the side apart from the gate electrode 217, so that the width of the memory functional unit 262 is defined as W2.

Figure 10:
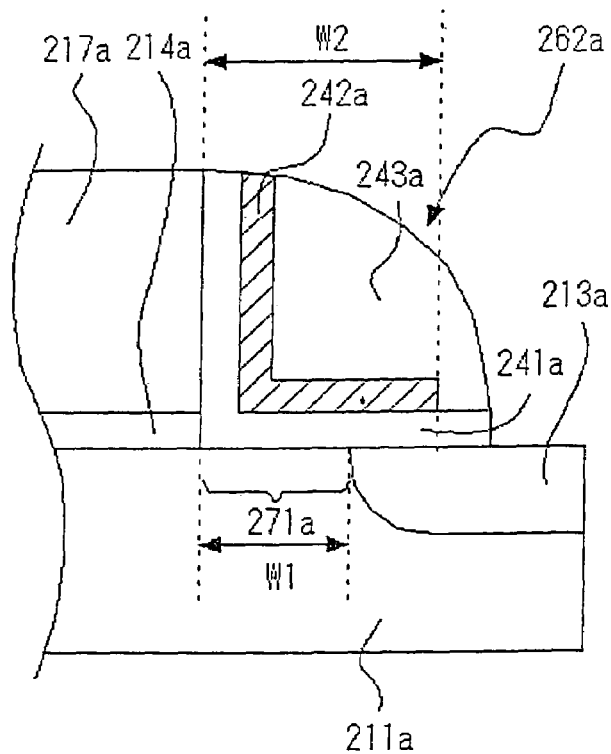
FIG. 10 is a schematic enlarged sectional view of a principal portion of a memory cell constituted a semiconductor memory device of the present invetion.

As shown in FIG. 10, when the end on the side apart from the gate electrode of a silicon nitride film 242a in a memory functional unit 262a does not match with the end of the memory functional unit 262a on the side apart from the gate electrode, W2 may be defined as a distance from the gate electrode end to an end on the side apart from the gate electrode of the silicon nitride film 242a.

Figure 11:
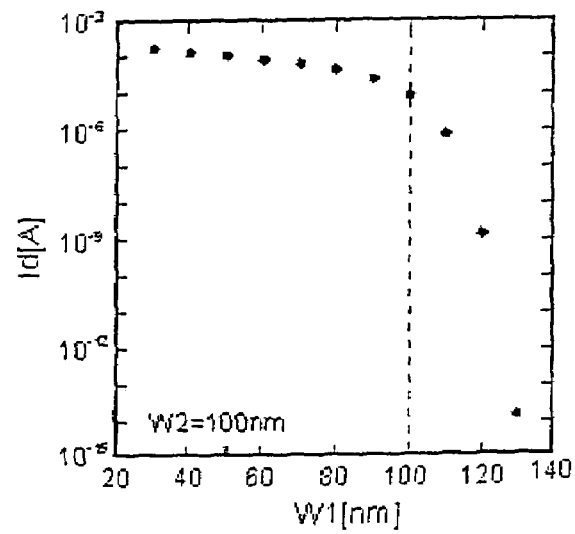
FIG. 11 is a diagram showing an electric characteristic of a memory cell constituted a semiconductor memory device of the present invention (Second Embodiment)

FIG. 11 shows drain current Id when the width W2 of the memory functional unit 262 is fixed to 100 nm and the offset amount W1 is changed in the structure of the memory cell of FIG. 9. Herein, the drain current was obtained by device simulation on assumption that the memory functional unit 262 is in erasing state (holes are accumulated), and the diffusion regions 212 and 213 serve as the source electrode and the drain electrode, respectively.

As obvious from FIG. 11, in the range where W1 is 100 nm or more (that is, the silicon nitride film 242 and the diffusion region 213 do not overlap with each other), the drain current sharply decreases. Since the drain current value is almost proportional to the reading operation speed, the performance of the memory sharply deteriorates with W1 of 100 nm or more. On the other hand, in the range where the silicon nitride film 242 and the diffusion region 213 overlap with each other, decrease in the drain current is gentle. Therefore, in the case of considering also variations in mass production, if at least a part of the silicon nitride film 242 as the film having the function of retaining charges does not overlap with the source and drain regions, it is difficult to obtain the memory function in reality.

On the basis of the result of the device simulation, memory cell arrays were produced by fixing W2 to 100 nm and setting W1 to 60 nm and 100 nm as design values. In the case where W1 is 60 nm, the silicon nitride film 242 and the diffusion regions 212 and 213 overlap with each other by 40 nm as a design value. In the case where W1 is 100 nm, there is no overlap as a design value. Reading time of the memory cell arrays was measured and worst cases considering variations were compared with each other. In the where W1 is set to 60 nm as a design value, read access time is 100 times as fast as that of the other case. In practice, the read access time is preferably 100 nsec or less per one bit. When W1=W2, the condition cannot be achieved. In the case of considering manufacture variations as well, it is more preferable that (W2−W1)>10 nm.

To read information stored in the memory functional unit 261 (region 281), in a manner similar to the first embodiment, it is preferable to set the diffusion region 212 as a source electrode, set the diffusion region 213 as a drain region, and form a pinch-off point on the side closer to the drain region in the channel region. Specifically, at the time of reading information stored in one of the two memory functional units, it is preferable to form the pinch-off point in a region closer to the other memory functional unit, in the channel region. With the arrangement, irrespective of a storage state of the memory functional unit 262, information stored in the memory functional unit 261 can be detected with high sensitivity, and it is a large factor to achieve 2-bit operation.

On the other hand, in the case of storing information only one of two memory functional units or in the case of using the two memory functional units in the same storage state, it is not always necessary to form the pinch-off point at the time of reading.

Although not shown in FIG. 8, it is preferable to form a well region (P-type well in the case of the N channel device) in the surface of the semiconductor substrate 211. By forming the well region, it becomes easy to control the other electric characteristics (withstand voltage, junction capacitance and short-channel effect) while setting the impurity concentration in the channel region optimum to the memory operations (rewriting operation and reading operation).

From the viewpoint of improving a memory retention characteristic, preferably, the memory functional unit includes a charge retaining film having the function of retaining charges and an insulating film. In the second embodiment, a silicon nitride film 242 having a level of trapping charges is used as the charge retaining film, and silicon oxide films 241 and 243 having the function of preventing dissipation of charges accumulated in the charge retaining are used as insulating films. The memory functional unit includes the charge retaining film and the insulating films, thereby preventing dissipation of charges, and the retention characteristic can be improved. The volume of the charge retaining film can be appropriately reduced, movement of charges in the charge retaining film can be regulated, and occurrence of a characteristic change due to charge movement during retention of information can be suppressed, as compared with the case where the memory functional unit is constructed only by the charge retaining film.

Figure 12:
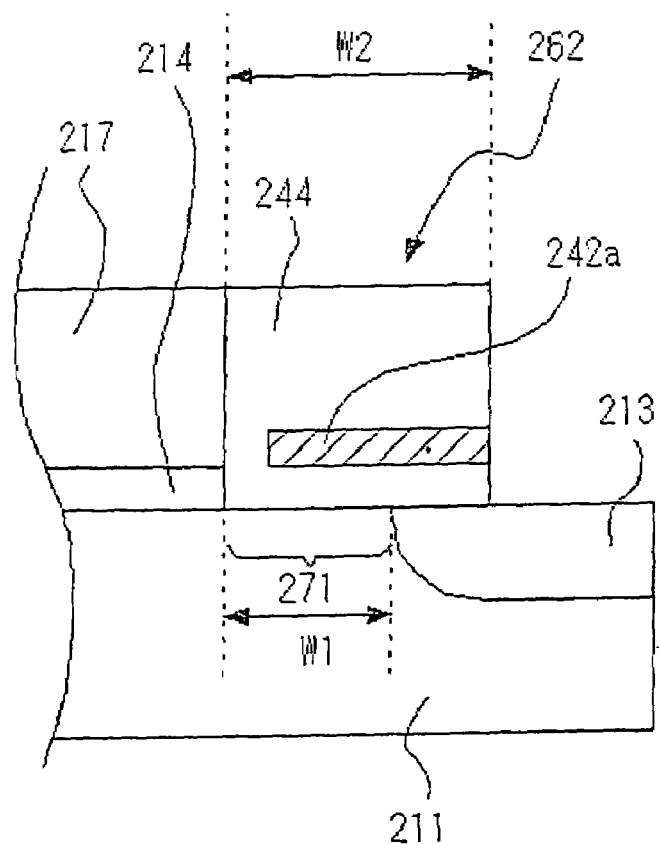
FIG. 12 is a schematic sectional view of a principal portion of an another memory cell constituted a semiconductor memory device of the present invention (Second Embodiment)

The memory functional unit preferably includes the charge retaining film disposed almost in parallel with the gate insulating film surface. In other words, it is preferable that the level of the top face of the charge retaining film in the memory functional unit is positioned parallel to the level of the top face of the gate insulating film. Concretely, as shown in FIG. 12, the silicon nitride film 242a as a charge retaining film of the memory functional unit 262 has a surface almost parallel with the surface of the gate insulating film 214. In other words, it is preferable that the silicon nitride film 242a is formed at a level parallel to the level corresponding to the surface of the gate insulating film 214.

Formation easiness of the inversion layer in the offset region 271 can be effectively controlled in accordance with the more or less of an amount of charges accumulated in the silicon nitride film 242a by the existence of the silicon nitride film 242a almost parallel to the surface of the gate insulating film 214 in the memory functional unit 262. Thus, the memory effect can be increased. Even in the case where the offset amount (W1) varies, a change in the memory effect can be maintained relatively small, and variations of the memory effect can be suppressed, by forming the silicon nitride film 242a almost in parallel with the surface of the gate insulating film 214. Moreover, movement of the charges upward in the silicon nitride film 242a is suppressed, and occurrence of a characteristic change due to the charge movement during retention of information can be suppressed.

Preferably, the memory functional unit 262 includes an insulating film (for example, portion on the offset region 271 in the silicon oxide film 244) for separating the silicon nitride film 242a which is almost parallel to the surface of the gate insulating film 214 from the channel region (or well region). By the insulating film, dissipation of the charges accumulated in the charge retaining film is suppressed and a memory cell having a better retention characteristic can be obtained.

The distance from the surface of the semiconductor substrate to charges accumulated in the charge retaining film can be maintained almost constant by controlling the thickness of the silicon nitride film 242a and controlling the thickness of the insulating film below the silicon nitride film 242a (portion on the offset region 271 in the silicon oxide film 244) to be constant. To be specific, the distance from the surface of the semiconductor substrate to the charges accumulated in the charge retaining film can be controlled in a range from the minimum thickness value of the insulating film under the silicon nitride film 242a to the sum of the maximum thickness value of the insulating film under the silicon nitride film 242a and the maximum thickness value of the silicon nitride film 242a. Consequently, density of electric lines of force generated by the charges accumulated in the silicon nitride film 242a can be almost controlled, and variations in the memory effect of the memory cell can be reduced very much.

THIRD EMBODIMENT

Figure 13:
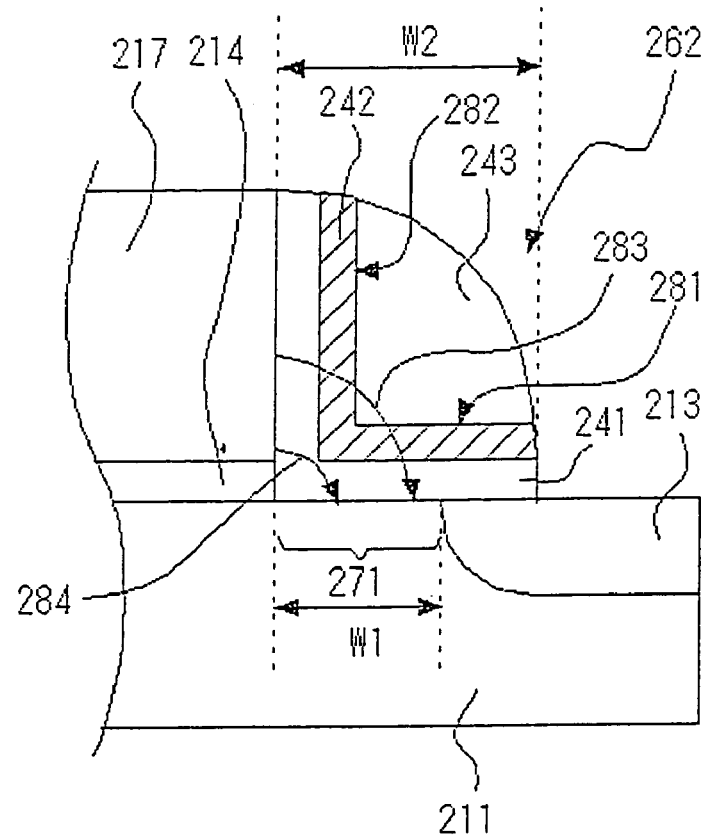
FIG. 13 is a schematic sectional view of a principal portion of a memory cell constituted a semiconductor memory device of the present invention (Third Embodiment)

The memory functional unit 262 in a semiconductor memory device of a third embodiment has a shape in which the silicon nitride film 242 as a charge retaining film has almost uniform thickness and is disposed almost in parallel with the surface of the gate insulating film 214 as shown in FIG. 13 (region 281) and, further, almost in parallel with a side face of the gate electrode 217 (region 282).

In the case where positive voltage is applied to the gate electrode 217, an electric line of force 283 in the memory functional unit 262 passes the silicon nitride film 242 twice (regions 282 and 281) as shown by an arrow. When negative voltage is applied to the gate electrode 217, the direction of the electric line of force becomes opposite. Herein, the dielectric constant of the silicon nitride film 242 is about 6, and that of silicon oxide films 241 and 243 is about 4. Therefore, effective dielectric constant of the memory functional unit 262 in the direction of the electric line of force 283 is higher and the potential difference at both ends of the electric line of force can be reduced more as compared with the case where only the region 281 of the charge retaining film exists. In other words, a large part of the voltage applied to the gate electrode 217 is used to enhance the electric field in the offset region 271.

The reason why charges are injected to the silicon nitride film 242 in the rewriting operation is because generated charges are attracted by the electric field in the offset region 271. Therefore, charges injected into the memory functional unit 262 increase in the rewriting operation, and the rewriting speed increases, by including the charge retaining film shown by the arrow 282.

In the case where the portion of the silicon oxide film 243 is also the silicon nitride film, that is, in the case where the level of the charge retaining film is not parallel with the level corresponding to the surface of the gate insulating film 214, upward movement of charges in the silicon nitride film becomes conspicuous, and the retention characteristic deteriorates.

More preferably, in place of the silicon nitride film, the charge retaining film is made of a high dielectric such as hafnium oxide having a very high dielectric constant.

It is preferable that the memory functional unit further includes an insulating film (portion on the offset region 271 in the silicon oxide film 241) for separating the charge retaining film almost parallel to the surface of the gate insulating film from the channel region (or well region). By the insulating film, dissipation of charges accumulated in the charge retaining film is suppressed, and the retention characteristic can be further improved.

Preferably, the memory functional unit further includes an insulating film (portion in contact with the gate electrode 217 in the silicon oxide film 241) for separating the gate electrode from the charge retaining film extended almost parallel with the side face of the gate electrode. The insulating film prevents injection of charges from the gate electrode into the charge retaining film and accordingly prevents a change in the electric characteristics. Thus, the reliability of the memory cell can be improved.

Further, in a manner similar to the second embodiment, it is preferable to control the thickness of the insulating film under the silicon nitride film 242 (portion on the offset region 271 in the silicon oxide film 241) to be constant and to control the thickness of the insulating film on the side face of the gate electrode (portion in contact with the gate electrode 217 in the silicon oxide film 241) to be constant. Consequently, the density of the electric lines of force generated by the charges accumulated in the silicon nitride film 242 can be almost controlled, and charge leak can be prevented.

FOURTH EMBODIMENT

In a fourth embodiment, optimization of the gate electrode, the memory functional unit, and the distance between the source and drain regions of a memory cell in a semiconductor memory device will be described.

Figure 14:
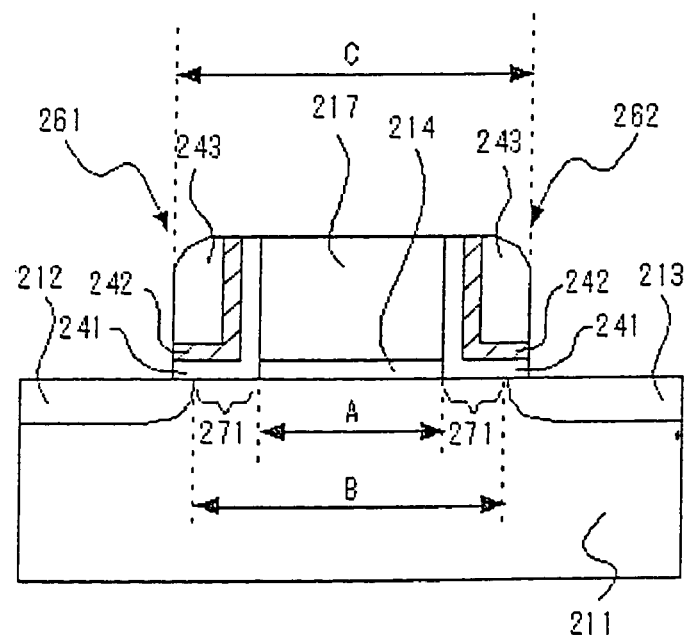
FIG. 14 is a schematic sectional view of a principal portion of a memory cell constituted a semiconductor memory device of the present invention (Forth Embodiment)

As shown in FIG. 14, a reference character A denotes length of the gate electrode in a cut surface in the channel length direction, a reference character B denotes the distance between the source and drain regions (channel length), and a reference character C denotes the distance from the end of one of memory functional units to the end of the other memory functional unit, that is, the distance between the end (on the side far from the gate electrode) of a film having the function of retaining charges in one of memory functional units to the end (on the side apart from the gate electrode) of a film having the function of retaining charges in the other memory functional unit in a cut surface in the channel length direction.

In such a memory cell, B<C is preferable. By satisfying such a relation, the offset regions 271 exist between the portion under the gate electrode 217 in the channel region and the diffusion regions 212 and 213. Consequently, easiness of inversion effectively fluctuates in the whole offset regions 271 by charges accumulated in the memory functional units 261 and 262 (silicon nitride films 242). Therefore, the memory effect increases and, particularly, higher-speed reading operation is realized.

In the case where the gate electrode 217 and the diffusion regions 212 and 213 are offset from each other, that is, in the case where the relation of A<B is satisfied, easiness of inversion in the offset region when voltage is applied to the gate electrode largely varies according to an amount of charges accumulated in the memory functional unit, so that the memory effect increases, and the short channel effect can be reduced.

However, as long as the memory effect appears, the offset region 271 does not always have to exist. Also in the case where the offset region 271 does not exist, if the impurity concentration in the diffusion regions 212 and 213 is sufficiently low, the memory effect can be exhibited in the memory functional units 261 and 262 (silicon nitride films 242).

Therefore, A<B<C is the most preferable.

FIFTH EMBODIMENT

Figure 15:
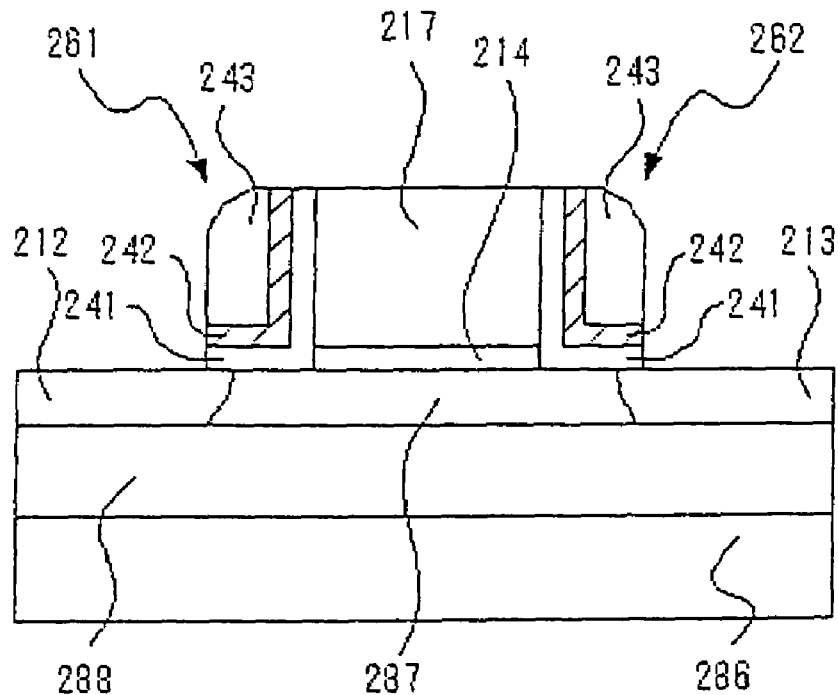
FIG. 15 is a schematic sectional view of a principal portion of a memory cell constituted a semiconductor memory device of the present invention (Fifth Embodiment)

A memory cell of a semiconductor memory device in a fifth embodiment has a substantially similar configuration to that of the second embodiment except that an SOI substrate is used as the semiconductor substrate in the second embodiment as shown in FIG. 15.

In the memory cell, a buried oxide film 288 is formed on a semiconductor substrate 286, and an SOI layer is formed on the buried oxide film 288. In the SOI layer, the diffusion regions 212 and 213 are formed and the other region is a body region 287.

By the memory cell as well, action and effect similar to those of the memory cell of the second embodiment are obtained. Further, junction capacitance between the diffusion regions 212 and 213 and the body region 287 can be remarkably reduced, so that higher-speed operation and lower power consumption of the device can be achieved.

SIXTH EMBODIMENT

Figure 16:
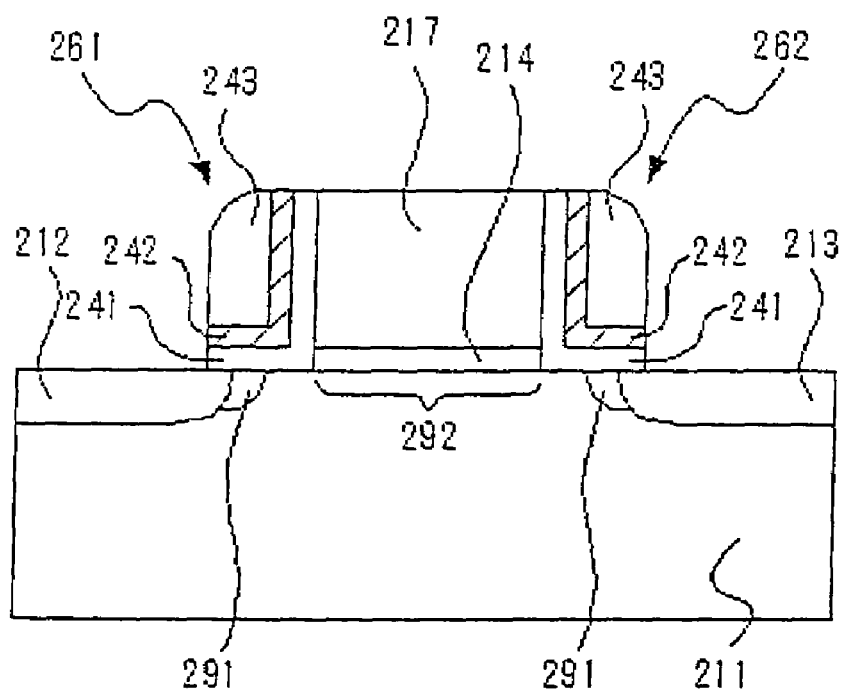
FIG. 16 is a schematic sectional view of a principal portion of a memory cell constituted a semiconductor memory device of the present invention (Sixth Embodiment)

A memory cell in a semiconductor memory device in a sixth embodiment has, as shown in FIG. 16, a configuration substantially similar to that of the memory cell of the second embodiment except that a P-type high-concentration region 291 is added adjacent to the channel sides of the N-type diffusion regions 212 and 213.

Specifically, the concentration of a P-type impurity (for example, boron) in the P-type high-concentration region 291 is higher than that of a P-type impurity in a region 292. Suitable P-type impurity concentration in the P-type high-concentration region 291 is, for example, about $5 \times 10^{17}$ to $1 \times 10^{19}$ cm$^{-3}$. The P-type impurity concentration of the region 292 can be set to, for example, $5 \times 10^{16}$ to $1 \times 10^{18}$ cm$^{-3}$.

By providing the P-type high-concentration region 291, the junction between the diffusion regions 212 and 213 and the semiconductor substrate 211 becomes sharp below the memory functional units 261 and 262. Consequently, hot carriers are easily generated in the writing and erasing operations, the voltage of the writing and erasing operations can be decreased or the writing operation and the erasing operation can be performed at high speed. Moreover, since the impurity concentration in the region 292 is relatively low, the threshold when the memory is in the erasing state is low, and the drain current is large. Consequently, the reading speed is improved. Therefore, the memory cell with low rewriting voltage or high rewriting speed and high reading speed can be obtained.

In FIG. 16, the threshold of the whole transistor remarkably increases, by providing the P-type high-concentration region 291 in the vicinity of the source/drain regions and below the memory functional unit (that is, not immediately below the gate electrode). The degree of increase is much higher than that in the case where the P-type high-concentration region 291 is positioned immediately below the gate electrode. In the case where write charges (electrons when the transistor is of the N-channel type) are accumulated in the memory functional unit, the difference becomes larger. On the other hand, in the case where sufficient erasing charges (positive holes when the transistor is of the N-channel type) are accumulated in the memory functional unit, the threshold of the whole transistor decreases to a threshold determined by the impurity concentration in the channel region (region 292) below the gate electrode. That is, the threshold in the erasing operation does not depend on the impurity concentration of the P-type high-concentration region 291 whereas the threshold in the writing operation is largely influenced. Therefore, only the threshold in the writing operation largely fluctuates, and the memory effect (the difference between the threshold in the writing operation and that in the erasing operation) can be remarkably increased, by disposing the P-type high-concentration region 291 under the memory functional unit and in the vicinity of the source/drain regions.

SEVENTH EMBODIMENT

Figure 17:
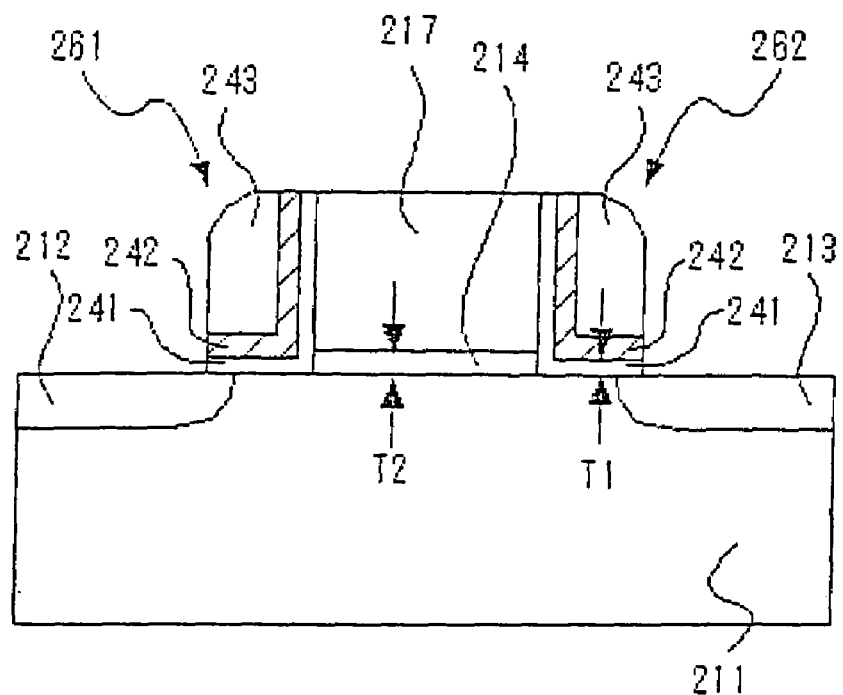
FIG. 17 is a schematic sectional view of a principal portion of a memory cell constituted a semiconductor memory device of the present invention (Seventh Embodiment)

A memory cell in a semiconductor memory device of a seventh embodiment has a configuration substantially similar to that of the second embodiment except that, as shown in FIG. 17, the thickness (T1) of an insulating film separating the charge retaining film (silicon nitride film 242) from the channel region or well region is smaller than the thickness (T2) of the gate insulating film.

The thickness T2 of the gate insulating film 214 has the lower limit value from the demand of withstand voltage at the time of rewriting operation of the memory. However, the thickness T1 of the insulating film can be made smaller than T2 irrespective of the demand of withstand voltage.

The flexibility of designing with respect to T1 is high in the memory cell for the following reason.

In the memory cell, the insulating film for separating the charge retaining film from the channel region or well region is not sandwiched by the gate electrode and the channel region or well region. Consequently, to the insulating film for separating the charge retaining film from the channel region or well region, a high electric field acting between the gate electrode and the channel region or well region does not directly act, but a relatively low electric field spreading from the gate electrode in the lateral direction acts. Consequently, irrespective of the demand of withstand voltage to the gate insulating film, T1 can be made smaller than T2.

By making T1 thinner, injection of charges into the memory functional unit becomes easier, the voltage of the writing operation and the erasing operation is decreased or the writing operation and erasing operation can be performed at high speed. Since the amount of charges induced in the channel region or well region when charges are accumulated in the silicon nitride film 242 increases, the memory effect can be increased.

The electric lines of force in the memory functional unit include a short one which does not pass through the silicon nitride film 242 as shown by an arrow 284 in FIG. 13. On the relatively short electric line of force, electric field intensity is relatively high, so that the electric field along the electric line of power plays a big role in the rewriting operation. By reducing T1, the silicon nitride film 242 is positioned downward in the figure, and the electric line of force indicated by the arrow 283 passes through the silicon nitride film. Consequently, the effective dielectric constant in the memory functional unit along the electric line of force 284 increases, and the potential difference at both ends of the electric line of force can be further decreased. Therefore, a large part of the voltage applied to the gate electrode 217 is used to increase the electric field in the offset region, and the writing operation and the erasing operation become faster.

In contrast, for example, in an EEPROM typified by a flash memory, the insulating film separating the floating gate and the channel region or well region is sandwiched by the gate electrode (control gate) from the channel region or well region, so that a high electric field from the gate electrode directly acts. Therefore, in an EEPROM, the thickness of the insulating film separating the floating gate from the channel region or well region is regulated, and optimization of the function of the memory cell is inhibited. As clear from the above, an essential reason for increasing the flexibility of T1 is that the insulating film separating the charge retaining film and the channel region or well region is not sandwiched between the gate electrode and the channel region or well region.

As obvious from the above, by setting T1<T2, without deteriorating the withstand voltage performance of the memory, the voltage of the writing and erasing operations is decreased, or the writing operation and erasing operation are performed at high speed and, further, the memory effect can be increased.

More preferably, the thickness T1 of the insulating film is 0.8 nm or more at which uniformity or quality by a manufacturing process can be maintained at a predetermined level and which is the limitation that the retention characteristic does not deteriorate extremely.

Concretely, in the case of a liquid crystal driver LSI requiring high withstand voltage in a large design rule, to drive the liquid crystal panel TFT, voltage of 15 to 18 V at the maximum is required normally, so that the gate oxide film cannot be thinned normally. In the case of mounting a nonvolatile memory for image adjustment on the liquid crystal driver LSI, in the memory cell of the present invention, the thickness of the insulating film separating the charge retaining film (silicon nitride film 242) from the channel region or well region can be designed optimally independently of the thickness of the gate insulating film. For example, the thickness can be individually set as T1=20 nm and T2=10 nm for a memory cell having a gate electrode length (word line width) of 250 nm, so that a memory cell having high writing efficiency can be realized (the reason why the short channel effect is not produced when T1 is larger than the thickness of a normal logic transistor is because the source and drain regions are offset from the gate electrode).

EIGHTH EMBODIMENT

Figure 18:
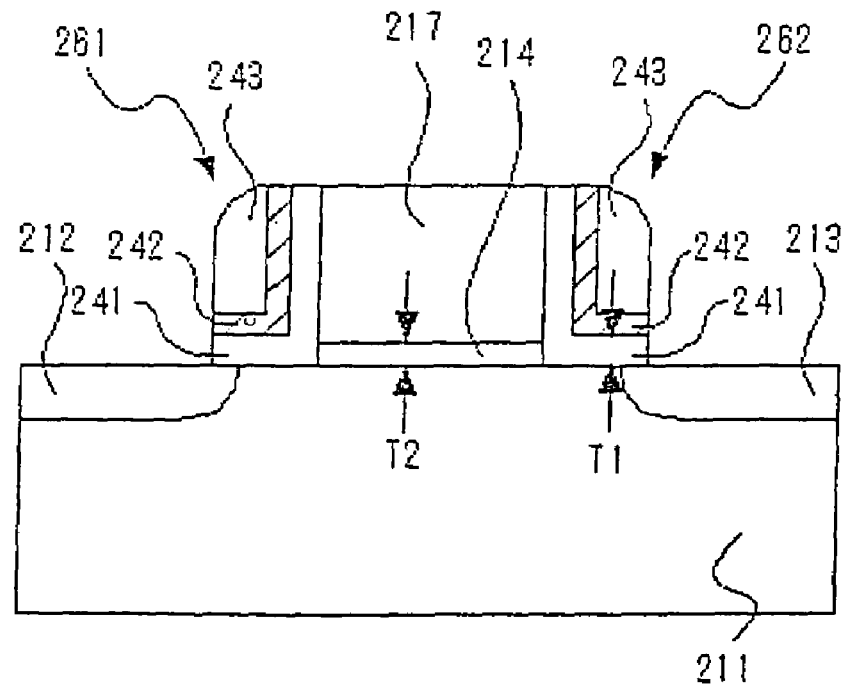
FIG. 18 is a schematic sectional view of a principal portion of a memory cell constituted a semiconductor memory device of the present invention (Eighth Embodiment)

A memory cell in a semiconductor memory device of an eighth embodiment has a configuration substantially similar to that of the second embodiment except that, as shown in FIG. 18, the thickness (T1) of the insulating film separating the charge retaining film (silicon nitride film 242) from the channel region or well region is larger than the thickness (T2) of the gate insulating film.

The thickness T2 of the gate insulating film 214 has an upper limit value due to demand of preventing a short channel effect of the cell. However, the thickness T1 of the insulating film can be made larger than T2 irrespective of the demand of preventing the short channel effect. Specifically, when reduction in scaling progresses (when reduction in thickness of the gate insulating film progresses), the thickness of the insulating film separating the charge retaining film (silicon nitride film 242) from the channel region or well region can be designed optimally independent of the gate insulating film thickness. Thus, an effect that the memory functional unit does not disturb scaling is obtained.

The reason why flexibility of designing T1 is high in the memory cell is that, as described already, the insulating film separating the charge retaining film from the channel region or well region is not sandwiched by the gate electrode and the channel region or well region. Consequently, irrespective of the demand of preventing the short channel effect for the gate insulating film, T1 can be made thicker than T2.

By making T1 thicker, dissipation of charges accumulated in the memory functional unit can be prevented and the retention characteristic of the memory can be improved.

Therefore, by setting T1>T2, the retention characteristic can be improved without deteriorating the short channel effect of the memory.

The thickness T1 of the insulating film is, preferably, 20 nm or less in consideration of decrease in rewriting speed.

Concretely, in a conventional nonvolatile memory typified by a flash memory, a selection gate electrode serves as a write erase gate electrode, and a gate insulating film (including a floating gate) corresponding to the write erase gate electrode also serves as a charge accumulating film. Since a demand for size reduction (thinning of a film is indispensable to suppress short channel effect) and a demand for assuring reliability (to suppress leak of retained charges, the thickness of the insulating film separating the floating gate from the channel region or well region cannot be reduced to about 7 nm or less) are contradictory, it is difficult to reduce the size. Actually, according to the ITRS (International Technology Roadmap for Semiconductors), there is no prospect of reduction in a physical gate length of about 0.2 micron or less. In the memory cell, since T1 and T2 can be individually designed as described above, size reduction is made possible.

For example, for a memory cell having a gate electrode length (word line width) of 45 nm, T2=4 nm and T1=7 nm are individually set, and a memory cell in which the short channel effect is not produced can be realized. The reason why the short channel effect is not produced even when T2 is set to be thicker than the thickness of a normal logic transistor is because the source/drain regions are offset from the gate electrode.

Since the source/drain regions are offset from the gate electrode in the memory cell, as compared with a normal logic transistor, reduction in size is further facilitated.

Since the electrode for assisting writing and erasing does not exist in the upper part of the memory functional unit, a high electric field acting between the electrode for assisting writing and erasing and the channel region or well region does not directly act on the insulating film separating the charge retaining film from the channel region or well region, but only a relatively low electric field which spreads in the horizontal direction from the gate electrode acts. Consequently, the memory cell having a gate length which is reduced to be equal to or less than the gate length of a logic transistor of the same process generation can be realized.

NINTH EMBODIMENT

A ninth embodiment relates to a change in the electric characteristic at the time of rewriting a memory cell of a semiconductor memory device.

Figure 19:
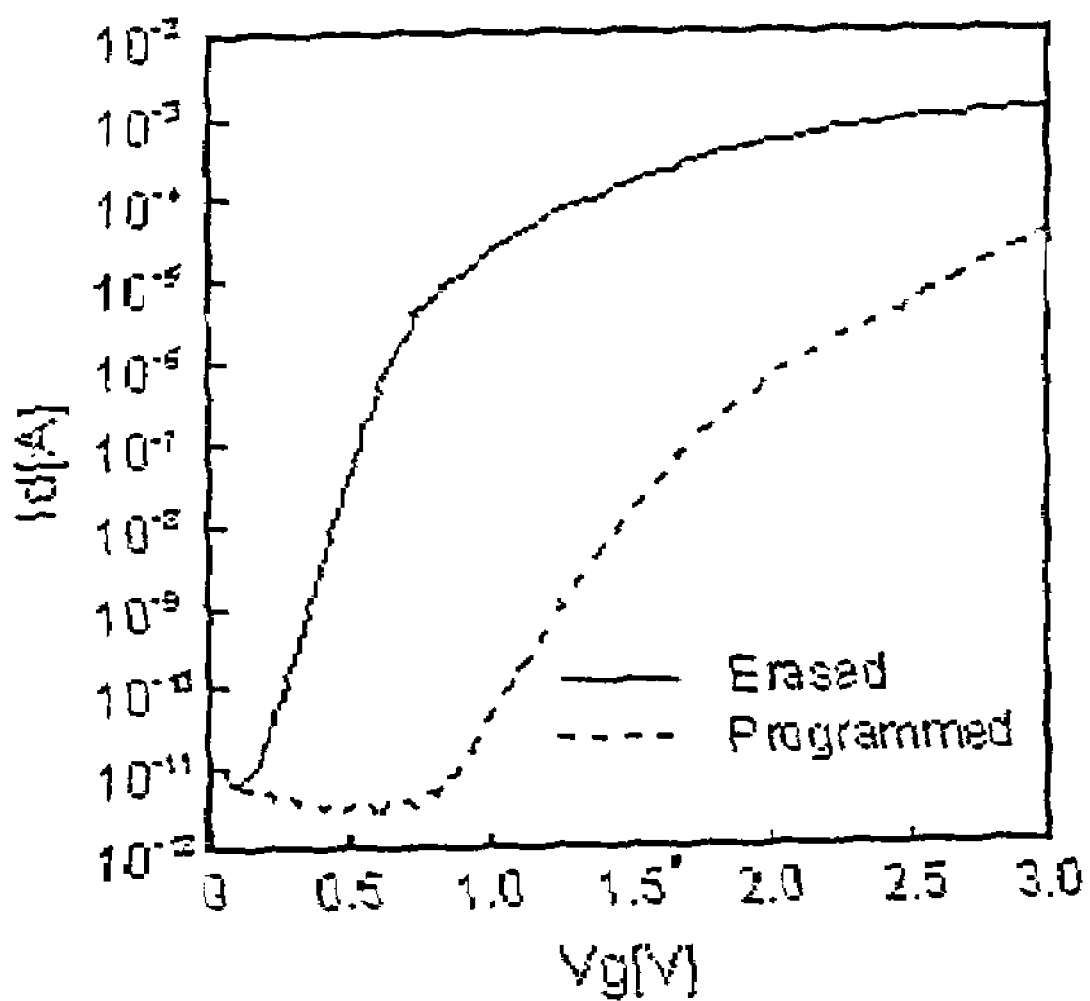
FIG. 19 is a diagram showing an electric characteristic of a memory cell constituted a semiconductor memory device of the present invention (Ninth Embodiment)

In an N-channel type memory cell, when an amount of charges in a memory functional unit changes, a drain current (Id)-gate voltage (Vg) characteristic (actual measurement value) as shown in FIG. 19 is exhibited.

Figure 28:
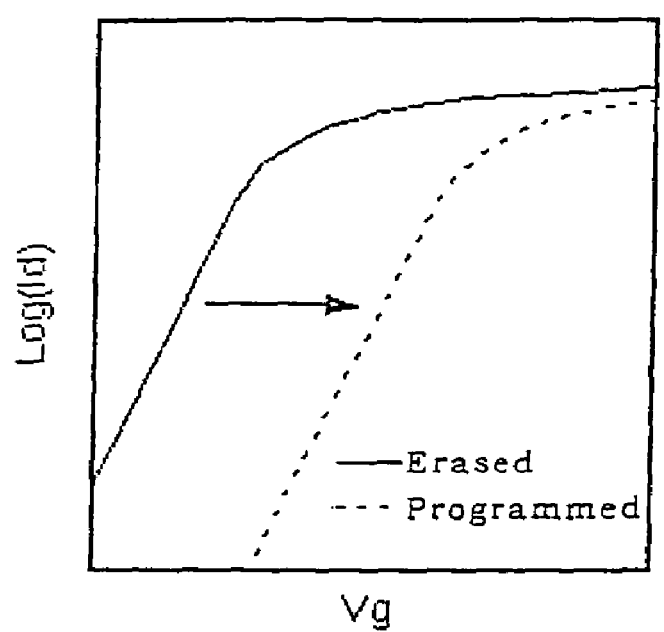
FIG. 28 is a diagram showing an electric characteristic of a flash memory of the conventional art.

As obvious from FIG. 19, in the case of performing a writing operation from an erasing state (solid line), not only the threshold simply increases, but also the gradient of a graph remarkably decreases in a sub-threshold region. Consequently, also in a region where a gate voltage (Vg) is relatively high, the drain current ratio between the erasing state and the writing state is high. For example, also at Vg =2.5 V, the current ratio of two digits or more is maintained. The characteristic is largely different from that in the case of a flash memory (FIG. 28).

Appearance of such a characteristic is a peculiar phenomenon which occurs since the gate electrode and the diffusion region are offset from each other, and the gate electric field does not easily reach the offset region. When the memory cell is in a writing state, even when a positive voltage is applied to the gate electrode, an inversion layer is extremely hard to be formed in the offset region under the memory functional unit. This is the cause that the gradient of the Id-Vg curve is gentle in the sub-threshold region in the writing state.

On the other hand, when the memory cell is in an erasing state, electrons of high density are induced in the offset region. Further, when 0 V is applied to the gate electrode (that is, when the gate electrode is in an off state), electrons are not induced in the channel below the gate electrode (consequently, an off-state current is small). This is the cause that the gradient of the Id-Vg curve is sharp in the sub-threshold region in the erasing state, and current increasing rate (conductance) is high in the region of the threshold or more.

As obviously understood from the above, in the memory cell in the semiconductor memory device of the present invention, the drain current ratio between the writing operation and the erasing operation can be particularly made high.

TENTH EMBODIMENT

A semiconductor memory device in which a memory array is constructed by arranging a plurality of memory cells of any of the first to eighth embodiments and to which rewriting and reading circuits and the like are added will be described below.

Figure 20:
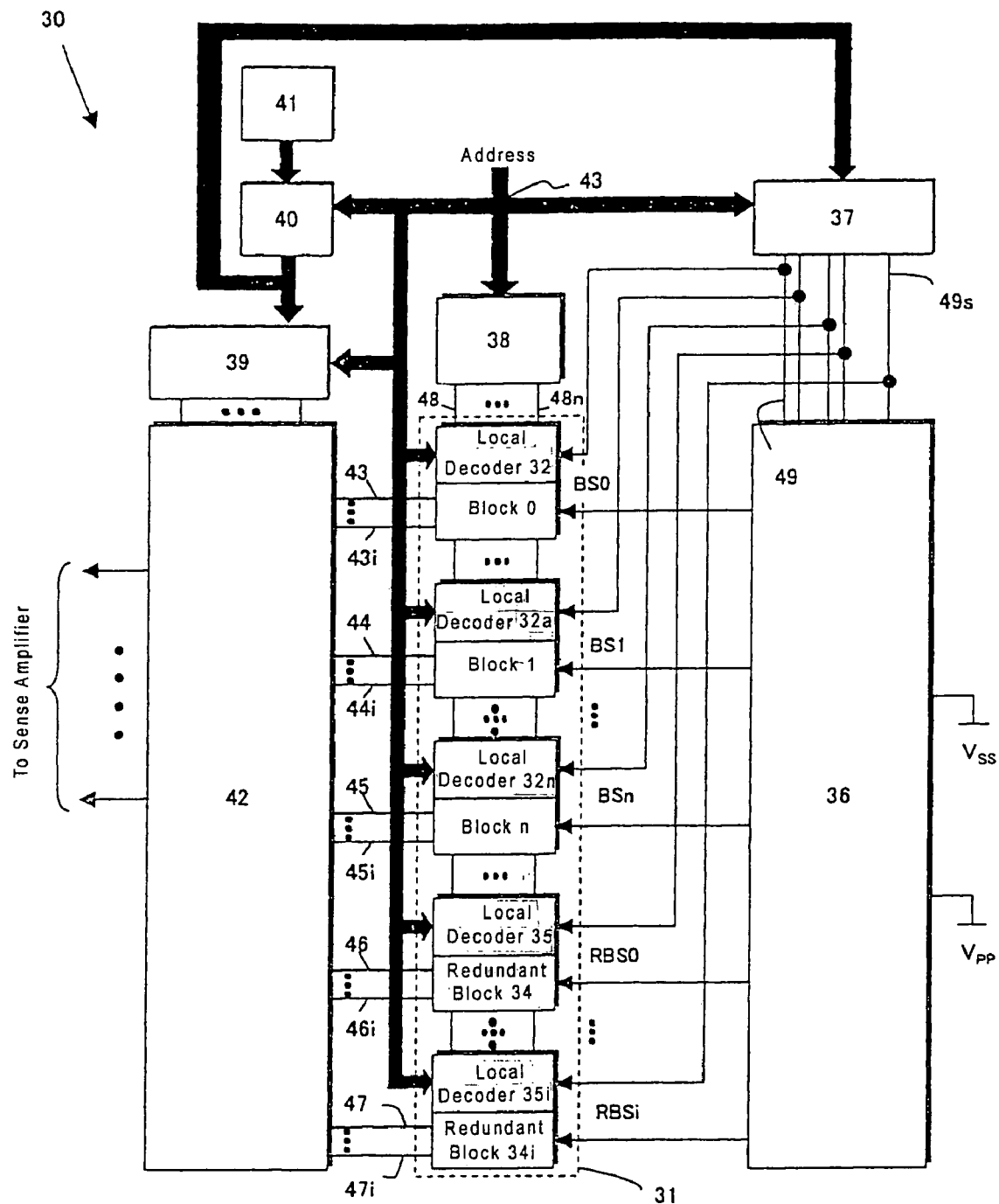
FIG. 20 is a block diagram of a semiconductor memory device of the present invention (Tenth Embodiment)

FIG. 20 is a block diagram of a semiconductor memory device 30 of the present invention. The semiconductor memory device 30 has a memory array 31. The memory array 31 includes a plurality of blocks 0 to n and redundant blocks 34 to 34i constructed by memory cells for storing data in accordance with an address, a plurality of local decoders, and local lines.

The block 0 has a local decoder 32, and the block 1 has a local decoder 32a. The redundant block 34 has a redundant local decoder 35, and the redundant block 34i has a redundant local decoder 35i. The blocks 0 to n and the redundant blocks 34 to 34i include a plurality of bit lines 43 to 43i, . . . , and 47 to 47i and local word lines (not shown). Each of the bit lines 43 to 43i, . . . , and 47 to 47i and the local word lines in the blocks extends only in a specific block. In other words, the bit lines 43 to 43i extend only in the block 0, and the bit lines 45 to 45i extend only in the block n.

The local word lines in the blocks 0 to n and the redundant blocks 34 to 34i are connected to local decoders 32 to 32n and redundant local decoders 35 to 35i in the blocks.

A memory cell is disposed at an intersecting point between a local word line and a bit line, and all of bit lines 43 to 43*i*, . . . , and 47 to 47*i* in the memory array 31 are connected to a Y gating circuit 42.

The memory array 31 has a plurality of global word lines 48 to 48*n*. The global word lines 48 to 48*n* are connected to the local decoders 32 to 32*n* and the redundant local decoders 35 to 35*i*. The global word lines 48 to 48*n* extend to all of the blocks 0 to n and the redundant blocks 34 to 34*i*. The global word lines 48 to 48*n* are not physically connected to the local word lines of the blocks of the memory array 31 but are electrically connected to local word lines of the blocks via the local decoders 32 to 32*n* and the redundant local decoders 35 to 35*i* in the blocks. That is, the global word lines 48 to 48*n* are connected to the local word line of the block 0 via the local decoder 32 and are connected to the local word line of the redundant block 34 via the redundant local decoder 35.

Alternatively, the memory array 31 may have a configuration in that each of the blocks 0 to n and the redundant blocks 34 to 34*i* has a plurality of word lines and local bit lines. In the configuration, the word lines and the local bit lines extend only in the block. The local bit line and the local decoder in each block are connected to each other. The memory array 31 has a plurality of global bit lines connected to all of blocks of the memory array 31. The global bit line is connected to the local decoder in each block and is connected to a Y decoder 39 via the Y gating circuit 42.

The global word lines 48 to 48*n* in the semiconductor memory device 30 are connected to a global X decoder 38 as a row decoder in the memory array 31. When a row address is given via a bus 43, the global X decoder 38 can select one of the global word lines 48 to 48*n* or allow at least one of the global word lines 48 to 48*n* to generate selection data. For example, the global X decoder 38 selects one of the selected global word lines 48 to 48*n* in accordance with all of given addresses. The global X decoder 38 may allow two or more of the global word lines 48 to 48*n* to generate selection data in accordance with a given address. The global X decoder 38 does not select any of local word lines in each of the blocks of the memory array 31.

Further, the semiconductor memory device 30 has the Y decoder 39 and the block decoder 37.

The Y decoder 39 is connected to the Y gating circuit 42. When a column address is given via the bus 43, the Y decoder 39 can select bit lines of one byte (that is, 8) or bit lines of one word (that is, 16) from a selected block in the memory array 31 via the Y gating circuit 42.

The block decoder 37 selects a selected block in accordance with all of given block addresses. In order to select the selected block, the block decoder 37 makes the local decoder of the selected block usable to thereby generate proper one of block selection signals BS0 to BSn. In order to make one of the redundant blocks 34 to 34*i* usable, the block decoder 37 can also make one of the redundant local decoders 35 to 35*i* usable by one of block selection signals RBS0 to RBSi. The block address is a part of a column address received by the Y decoder 39. The block selection signals BS0 to BSn and RBS0 to RBSn are outputted from the block decoder 37, via block selection lines 49 to 49*s*.

The block selection lines 49 to 49*s* are connected to an erase switch 36.

The erase switch 36 has a plurality of switches. Each of the switches is connected to a common source line (not shown) of one of the blocks 0 to n and the redundant blocks 34 to 34*i*. The erase switch 36 selectively connects a Vss (ground) voltage or a Vpp (erase) voltage to a common source line of a related block in accordance with the block selection signal from one of the block selection lines 49 to 49*s*. This connecting operation is performed during a memory operation (that is, reading, writing, or erasing operation).

To the local decoder in one of the blocks 0 to n and the redundant blocks 34 to 34*i*, one of the block selection signals BS0 to BSn and RBS0 to RBSn is supplied. For example, the block selection signal BS0 is given to the local decoder 32, and the block selection signal RBS0 is given to the redundant local decoder 35. When the block selection signal BS0 is given by the block decoder 37, the local decoder 32 can receive selected data from the global word lines 48 to 48*n* and selects one of the local word lines in the block 0. When the block selection signal RBS0 is given by the block decoder 37, the redundant local decoder 35 can receive selected data from the global word lines 48 to 48*n*, and selects one of the local word lines in the redundant block 34.

Further, the semiconductor memory device 30 has a comparison logic 40 and a CAM (Content Associative Memory) set 41 connected to the comparison logic 40. As the comparison logic 40, any known comparison logic may be used. The CAM set 41 has a plurality of CAM cells, and each CAM cell functions as a storage for storing data. For example, each CAM set 41 has a 14-bit width, and eight CAM sets are provided. Alternatively, the number of the CAM sets 41 may be larger than or smaller than eight, and each CAM set may have a width which is larger than or smaller than 14 bits.

Each CAM set 41 is used to make a redundant block usable so as to replace a defective block. In order to replace a defective block, the CAM set stores block addresses of the defective block and the redundant block. Specifically, when a defect is found in the block 1 and the block 1 has to be replaced with the redundant block 34*i*, the block addresses of the block 1 and the redundant block 34*i* are stored in the CAM set 41. Whenever the address is given to the bus for sending the address to the block, the address is also given to the comparison logic 40.

Figure 21:
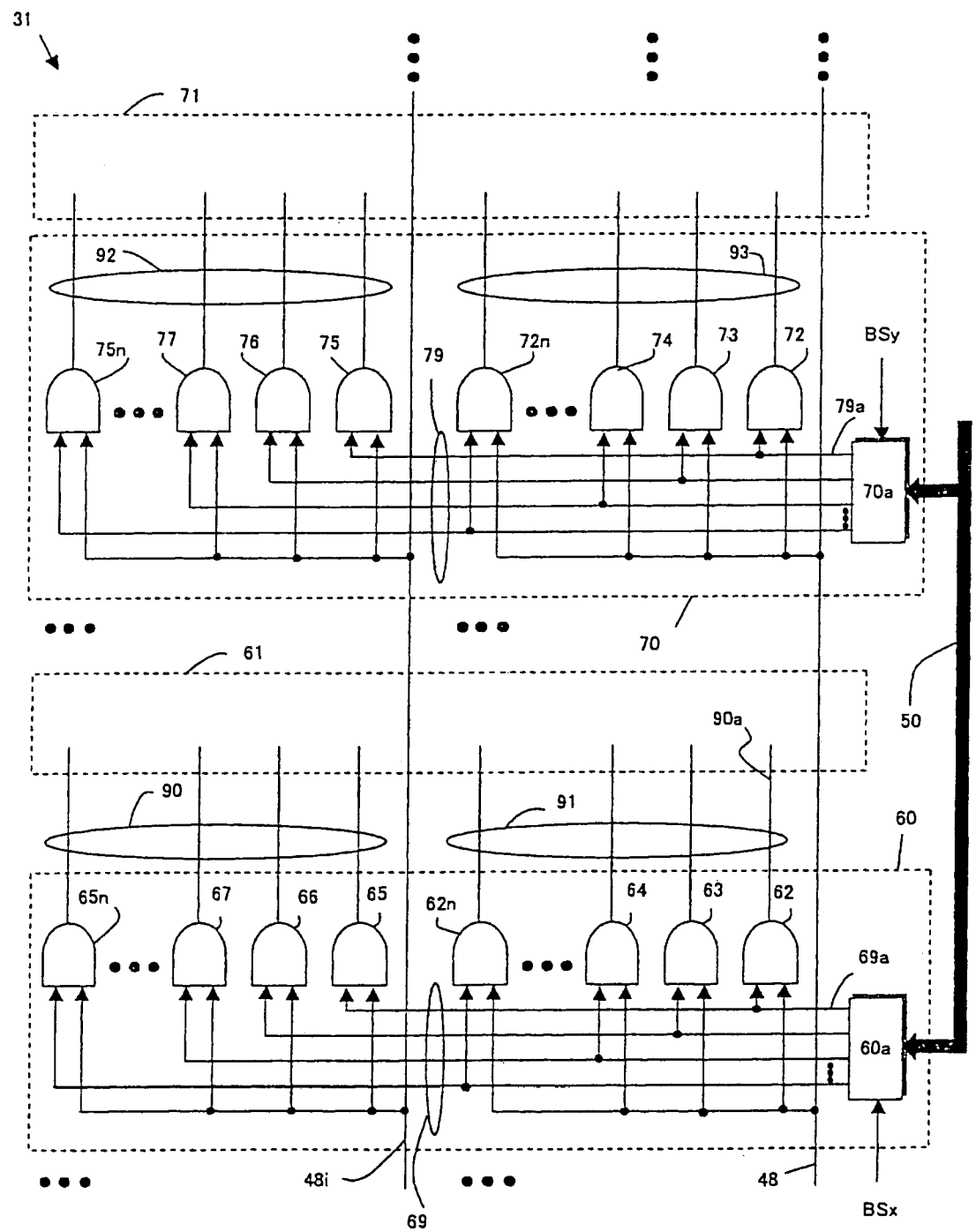
FIG. 21 is a further block diagram of a semiconductor memory device of the present invention (Tenth Embodiment)

The semiconductor memory device 30 of the present invention may have a memory array 31 shown in FIG. 21 in place of the memory array 31 shown in FIG. 20. In FIG. 21, only two global word lines 48 and 48*i* are shown.

The memory array 31 has memory blocks 61 and 71 and local decoders 60 and 70 as two decoders adjacent to the local decoders 32 to 32*i* and 35 to 35*i*, which correspond to two adjacent blocks in the blocks 0 to n and the redundant blocks 34 and 34*i* shown in FIG. 20. The global word lines 48 and 48*i* are connected to a plurality of word lines 90 to 93 in the blocks via the local decoders 60 and 70. For example, the global word line 48 is connected to a plurality of local word lines 90 in the memory block 61 via the local decoder 60, and a plurality of local word lines 92 in the memory block 71 via the local decoder 70. Similarly, the global word line 48*i* is connected to a plurality of local word lines 91 in the memory block 61 via the local decoder 60, and a plurality of local word lines 93 in the memory block 71 via the local decoder 70. The local word lines 90 to 93 are connected to gate electrodes of memory cells in the row direction in the memory blocks 61 and 71. Although memory cells in the memory blocks and the like in the memory array are not shown in FIG. 21, the memory array or memory blocks and redundant blocks may be disposed as indicated by reference numerals 321, 421, 521 and the like in FIGS. 22 to 24.

Figure 22:
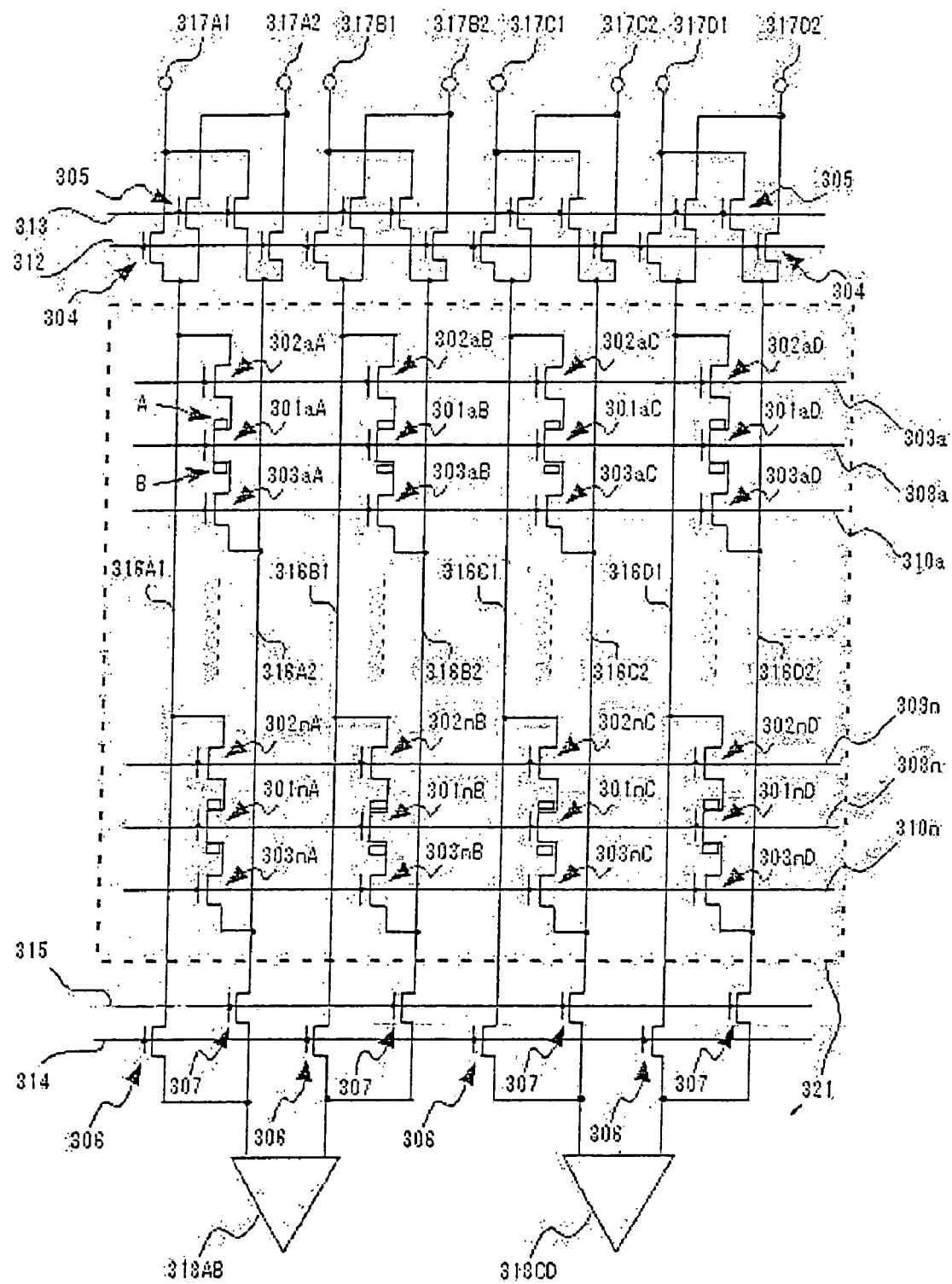
FIG. 22 is a circuit diagram of a memory block constituted a semiconductor memory device of the present invention (Tenth Embodiment)

In FIG. 22, memory cells 301*a*A to 301*a*D, . . . , and 301*n*A to 301*n*D arranged in a portion (321) are the memory cells described in any of the first to eighth embodiments. The memory cell has two memory functional units. In order to discriminate the two memory functional units from each other, in FIG. 20, the arrows A and B are designated only to the memory cell 301aA, and the arrows are not shown for the other memory cells.

Two selection transistors are connected on both sides of each memory cell. For example, to the memory cell 301aA, selection transistors 302aA and 303aA are connected in series.

The gate electrodes of the memory cells 301aA to 301aD are connected to a word line 308a. The gate electrodes of the other memory cells are also similarly connected to word lines. Selection transistors 302aA to 302aD are connected to a selection transistor word line 309a, and selection transistors 303aA to 303aD are connected to a selection transistor word line 310a. The gate electrodes of the other selection transistors are also similarly connected to selection transistor word lines.

Each of the selection transistors 302aA to 302nA is connected to a first bit line 316A1, and each of selection transistors 303aA to 303nA is connected to a second bit line 316A2. Each of the other selection transistors is similarly connected to the first or second bit line.

To each bit line, a pair of operation selection transistors 304 and 305 is connected. The gate electrodes of the operation selection transistors 304 and 305 are connected to operation selection lines 312 and 313, respectively.

Two pairs of bit lines, for example, the first bit lines 316A1 to 316D1 are connected to a first switch transistor 306. The second bit lines 316A2 to 316D2 are connected to a second switch transistor 307. The gate electrodes of the switch transistors 306 and 307 are connected to switch transistor selection lines 314 and 315, respectively.

Figure 23:
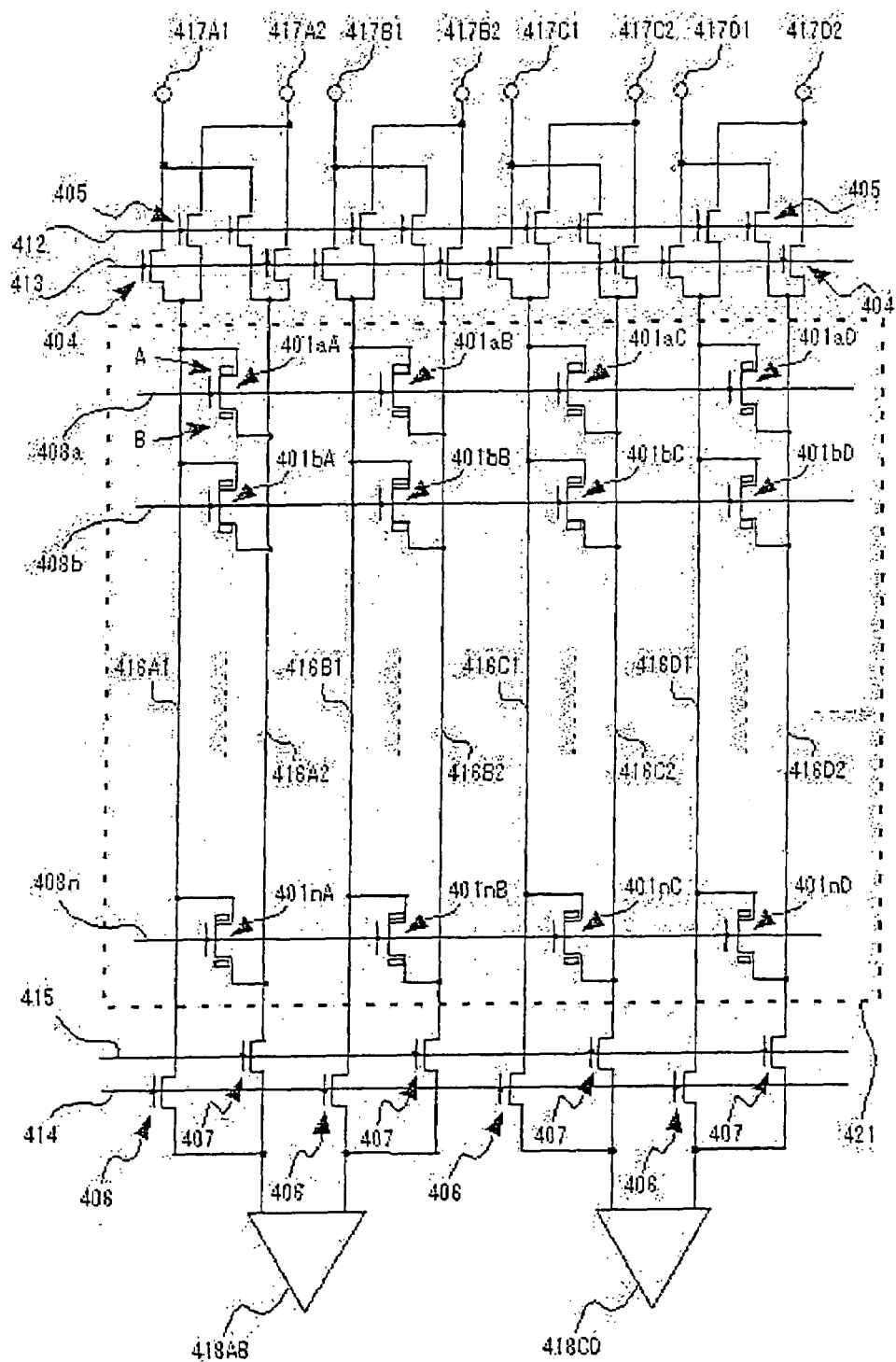
FIG. 23 is a further circuit diagram of a memory block constituted a semiconductor memory device of the present invention (Tenth Embodiment)

FIG. 23 is different from FIG. 22 only with respect to a memory block 421. Operation selection transistors 404 and 405, operation selection lines 412 and 413, a first switch transistor 406, a second switch transistor 407, switch transistor selection lines 414 and 415, and word lines 408a to 408n are similar to those in FIG. 22. That is, memory cells 401aA to 401aD, . . . , and 401nA to 401nD are directly connected to first bit lines 416A1 to 416D1 and second bit lines 416A2 to 416D2.

Figure 24:
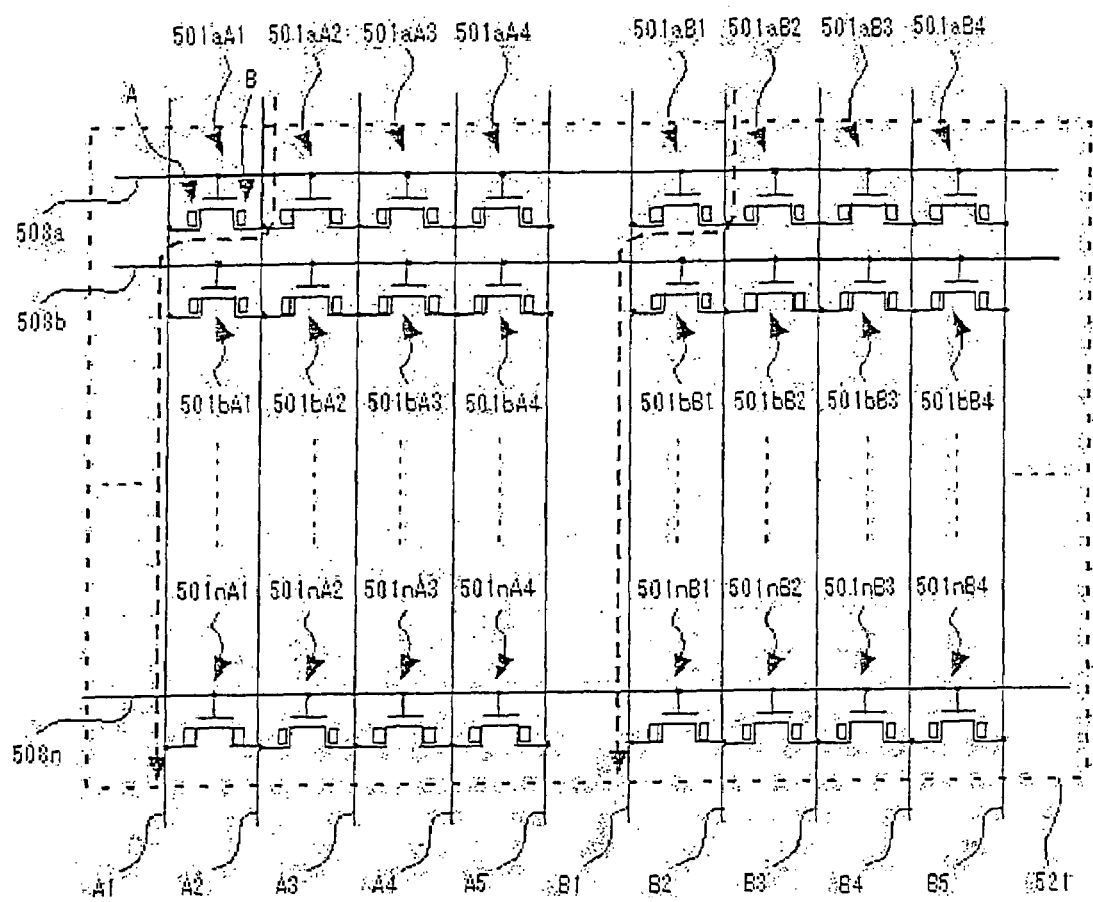
FIG. 24 is a still further circuit diagram of a memory block constituted a semiconductor memory device of the present invention (Tenth Embodiment)

Further, in FIG. 24, a reference numeral 521 denotes a memory block, reference characters 501aA1 to 501aA4, 501aB1 to 501aB4, . . . , and 501nB1 to 501nB4 denote memory cells, reference characters 508a to 508n denote word lines, and reference characters A1 to A5 and B1 to B5 denote bit lines.

In FIG. 21, the local decoder 60 has an address decoder 60a and a plurality of AND gates 62 to 65, 62n and 65n, and the local decoder 70 has an address decoder 70a, and a plurality of AND gates 72 to 75, 72n and 75n. The AND gates 62 to 65, 62n, 65n, 72 to 75, 72n and 75n are connected to the global word lines 48 and 48i, and selection lines 69 and 79 of the address decoders 60a and 70a. Specifically, the address decoder 60a has a plurality of selection lines 69a, . . . each of which is connected to one of the AND gates 62 to 65, 62n and 65n. The address decoder 70a has a plurality of selection lines 79a . . . each of which is connected to one of AND gates 72 to 75, 72n and 75n. Each of the AND gates 62 to 65, 62n, 65n, 72 to 75, 72n and 75n may be replaced with a logic circuit of another type.

Each of the address decoders 60a and 70a receives a part of an X address. The address decoder 60a is made usable by a block selection signal BSx, and the address decoder 70a is made usable by a block selection signal BSy. In FIG. 21, each of the decoders 60a and 70a is connected to the bus 50 in FIG. 20 and receives a part of the X address, and the global X decoder 38 receives a part of the remaining X address.

For example, when the global word line 48 is a selected global word line and the memory block 61 is a selected block for memory operation, the signal BSx makes the address decoder 60a usable and, on the other hand, the signal BSy makes the decoder 70a unusable. Subsequently, the address decoder 60a decodes, for example, an address bit received via the bus 50 in order to select the selection line 69a. It enables the AND gate 62 to be used, and the selected global word line 48 is connected to a local word line 90a. Although the AND gate 65 is also made usable at this time, the global word line 48i is not selected so that the AND gate 65 does not select a corresponding local word line 91a. During the period, the address decoder 70a is unusable and any of the selection lines 79 is not selected. Consequently, all of the AND gates 72 to 72n are blocked, and all of the local word lines 92 are not connected to the selected global word line 48.

ELEVENTH EMBODIMENT

An operation method of a semiconductor memory device shown in FIG. 20 will be described below.

When an address is given to the bus 43 in the writing operation, the comparison logic 40 compares an incoming address with block addresses of all of defective blocks stored in the CAM set 41. When an incoming address is directed to the block 1, the block 1 is replaced with a redundant block (that is, the comparison logic 40 detects a match), and the comparison logic 40 does not allow the block decoder 37 to act on the basis of the incoming address. Further, by supplying the block address of the redundant block 34i to the block decoder 37, the comparison logic 40 makes the redundant local decoder 35i usable in place of the local decoder 33. Further, the comparison logic 40 makes the Y decoder 39 act on the basis of the block address of the redundant block 34i in place of the incoming block address.

In order to increase the speed of the reading operation, the block decoder 37 can assert all of the block selection signals BS0 to BSn and RBS0 to RBSn. Alternatively, in order to enhance the power of the semiconductor memory device 30, the comparison logic 40 can make block selection signals unusable of all of defective blocks in the memory array 31. When an address is received in the reading operation, the comparison logic 40 compares the block addresses of all of defective blocks accumulated in the CAM set 41 with the incoming address. If an incoming address is directed to the block 1 and the block 1 is replaced with the redundant block 34i (that is, when the comparison logic 40 detects a match), the comparison logic 40 makes the Y decoder 39 act on the basis of a block address of the redundant block 34i in place of the block address of the incoming address.

At the time of erasing operation, since a Y address includes only the block address of a selected block, the comparison logic 40 does not make the Y decoder 39 act.

When an access to the redundant block 34i is regulated by the comparison logic 40 each time an address is directed to the block 1, the block decoder 37 asserts the block selection signal RBSi and disasserts the block selection signal BS1.

TWELFTH EMBODIMENT

Figure 25:
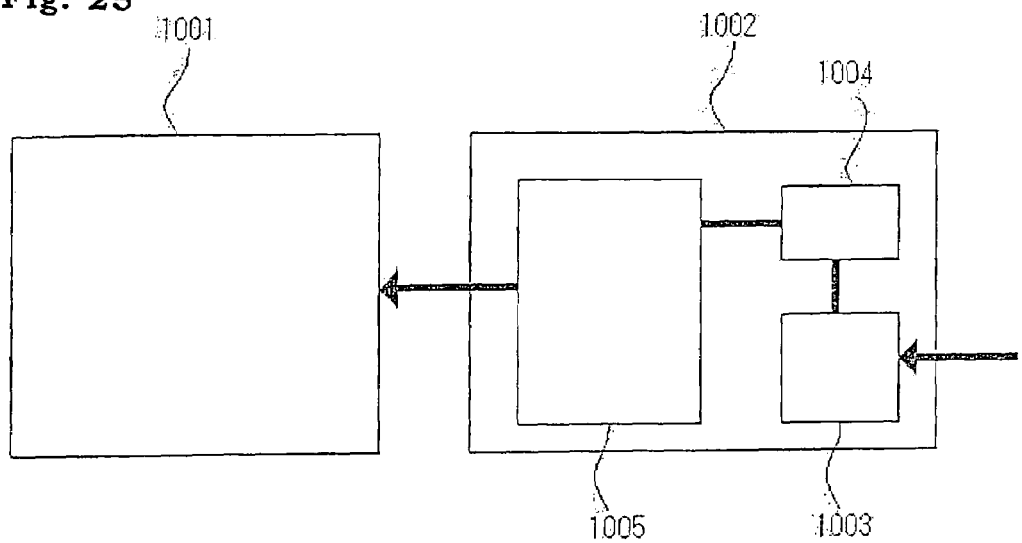
FIG. 25 is a schematic block diagram of a liquid crystal device assembled a semiconductor memory device of the present invention (Twelfth Embodiment)

As an application example of the semiconductor memory device, a rewritable nonvolatile memory for image adjustment of a liquid crystal panel as shown in FIG. 25 is mentioned.

A liquid crystal panel 1001 is driven by a liquid crystal driver 1002. In the liquid crystal driver 1002, a nonvolatile memory 1003, an SPAN 1004 and a liquid crystal driver circuit 1005 are provided. The nonvolatile memory 1003 is constructed by the memory cell of an embodiment of the present invention, more preferably, the semiconductor memory device of the tenth or eleventh embodiment. The nonvolatile memory 1003 can be rewritten from the outside.

Information stored in the nonvolatile memory 1003 is transferred to the SRAM 1004 at the time of turn-on of the power source of an apparatus. The liquid crystal driver circuit 1005 can read stored information from the SRAM 1004 as necessary. By providing the SRAM, high reading speed of stored information can be achieved.

The liquid crystal driver 1002 may be externally attached to the liquid crystal panel 1001 as shown in FIG. 25 or formed on the liquid crystal panel 1001.

In a liquid crystal panel, tones to be displayed are changed by applying voltages in multiple grades to pixels. The relation between the given voltage and the displayed tone varies according to products. Consequently, information for correcting variations in products after completion of the product is stored and correction is made on the basis of the information, thereby enabling the picture qualities of products to be made uniform. It is therefore preferable to mount a rewritable nonvolatile memory for storing the correction information. As the nonvolatile memory, it is preferable to use the memory cell of an embodiment of the present invention. Particularly, it is preferable to use the semiconductor memory device of the tenth or eleventh embodiment in which memory cells of the present invention are integrated. By using the memory cell of an embodiment of the present invention as the nonvolatile memory for image adjustment of the liquid crystal panel, a process for forming the memory cell together with a liquid crystal driver and the like is easy, so that the manufacturing cost can be reduced. The memory scale of any of the semiconductor memory devices of the tenth and eleventh embodiments is relatively small and is particularly suitable in the case where reliability or stability is important. Since outputs of two memory cells (pair of memory cells) are inputted to the same sense amplifier and the difference between currents flowing in the two memory cells having similar device structures is detected, the reading operation can be performed stably and reliably. Consequently, although an area per bit increases, when the memory scale is small, as compared with the other circuit area, the increasing ratio is permissible. Usually, a nonvolatile memory for image adjustment of a liquid crystal panel has a capacity of, for example, a few kilobytes, and its memory scale is relatively small. Therefore, it is particularly preferable to use any of the semiconductor memory devices of the tenth and eleventh embodiments as the nonvolatile memory for image adjustment of the liquid crystal panel.

THIRTEENTH EMBODIMENT

Figure 26:
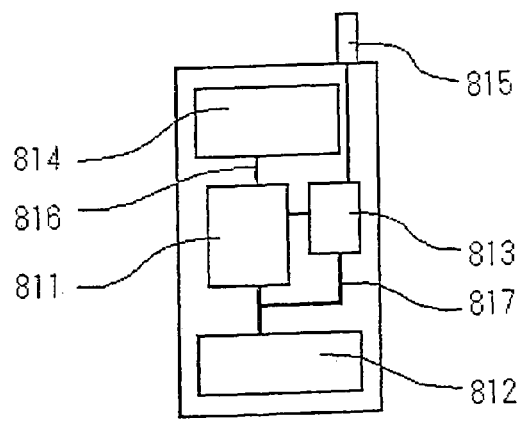
FIG. 26 is a schematic block diagram of a portable electronic apparatus assembled a semiconductor memory device of the present invention (Thirteenth Embodiment)
Figure 27:
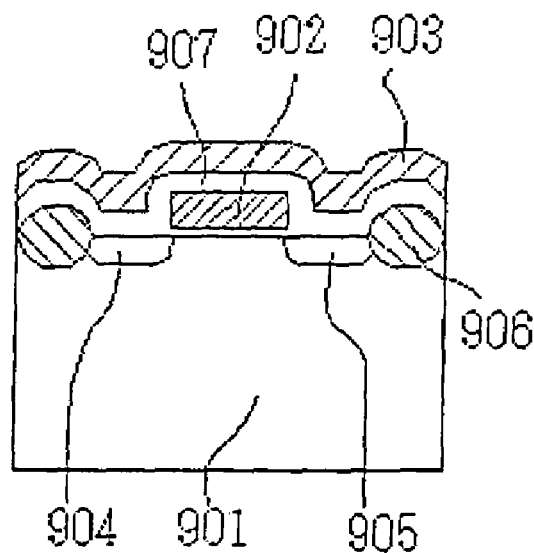
FIG. 27 is a schematic sectional view of a principal portion of a flash memory of the conventional art.

FIG. 26 shows a portable telephone as a portable electronic apparatus in which the semiconductor memory device is assembled.

The portable telephone is constructed mainly by a control circuit 811, a battery 812, an RF (radio frequency) circuit 813, a display 814, an antenna 815, a signal line 816, a power source line 817 and the like. In the control circuit 811, the semiconductor memory device of an embodiment of the present invention is assembled. The control circuit 811 is preferably an integrated circuit using cells having the same structure as a memory circuit cell and a logic circuit cell as described in the tenth embodiment. It facilitates fabrication of the integrated circuit, and the manufacturing cost of the portable electronic apparatus can be particularly reduced.

The operation speed of the portable electronic apparatus is increased, and the manufacturing cost can be reduced, by using the semiconductor memory device capable of performing high-speed reading operation and whose process of mounting a memory part and a logic circuit part simultaneously is easy for a portable electronic apparatus. Thus, a cheap, high-reliability, and high-performance portable electronic apparatus can be obtained.

According to the semiconductor memory device of an embodiment of the present invention, the memory cell has separately the memory function of the memory functional unit and the transistor operation function of the gate insulating film. Consequently, while assuring the sufficient memory function, the gate insulating film can be thinned, the short channel effect can be suppressed, and reduction in size can be achieved. Therefore, even when a redundant block and the like are provided, increase in the chip area can be suppressed, and the packing density of the semiconductor memory device itself can be increased.

In the case where the memory functional unit of the memory cell includes a film having the function of retaining charges and of which surface is almost parallel with the surface of a gate insulating film, variations in the memory effect can be reduced, and a change in the characteristics during retention can be suppressed. Therefore, the yield of the chip can be improved. By reducing the manufacturing cost, the cheap semiconductor memory device can be obtained. In addition, the number of redundant blocks can be reduced, so that the chip area can be further reduced. Moreover, the forming process is highly compatible with the normal transistor forming process and it is easy to form both a normal transistor and the memory cell. Thus, as compared with the case of forming both a conventional flash memory as a nonvolatile memory cell and a peripheral circuit constructed by a normal transistor, the number of masks and the number of processes can be dramatically reduced, so that the yield can be improved. Therefore, the number of redundant blocks can be further reduced and the cheaper semiconductor memory device realizing higher packing density can be obtained.

What is claimed is:

1. A semiconductor memory device comprising:
    (A) a global line;
    (B) a memory array having
        (i) a local line,
        (ii) a decoder connected to the global line and the local line, and
        (iii) a memory block and a redundant block each constructed by a plurality of memory cells each having a gate electrode formed on a semiconductor layer via a gate insulating film, a channel region disposed below the gate electrode, a diffusion region disposed on both sides of the channel region and having a conductive type opposite to that of the channel region, and a memory functional unit formed on both sides of the gate electrode and having the function of retaining charges,
    the memory array having the function that when the decoder is usable, the global line is selectively connected to the local line in accordance with address information and, when a defective block is the memory block and the decoder is unusable, the local line is operatively disconnected from the global line and the defective block is replaced with the redundant block; and
    (C) a circuit for making the decoder of the defective block unusable and, only when the defective block is addressed, for making the decoder of the redundant block usable.

2. The semiconductor memory device according to claim 1, wherein the memory array accumulates a plurality of bit data at once, has an electrically erasable and writable memory block and the redundant block.

3. The semiconductor memory device according to claim 1 wherein the semiconductor memory device is an electrically erasable and writable memory.

4. The semiconductor memory device according to claim 1 wherein the semiconductor memory device is used for a data processing system.

5. The semiconductor memory device according to claim 1 wherein the global line is a global word line and the local line is a local word line.

6. The semiconductor memory device according to claim 1 wherein the global line is a global bit line and the local line is a local bit line.

7. The semiconductor memory device according to claim 1 wherein the memory functional unit has the surface which is almost parallel with the surface of the gate insulating film and has a function of retaining a charge.

8. A portable electronic apparatus in which the semiconductor memory device according to claim 1 is incorporated.

9. A semiconductor memory device comprising:
(A) a plurality of global lines each selected in accordance with an address;
(B) a memory array having
  (i) a plurality of local lines,
  (ii) a plurality of selection transistors for connecting one of the global lines to one of the local lines in accordance with a block selection signal, and
  (iii) a memory block and a redundant block each constructed by a plurality of memory cells each having a gate electrode formed on a semiconductor layer via a gate insulating film, a channel region disposed below the gate electrode, a diffusion region disposed on both sides of the channel region and having a conductive type opposite to that of the channel region, and a memory functional unit formed on both sides of the gate electrode and having the function of retaining charges,
the memory array having the function that the redundant block is replaced with a defective memory block; and
(C) a circuit for making the selection transistor in the defective block unusable and, only when the defective block is addressed, for making the selection transistor in the redundant block usable.

10. The semiconductor memory device according to claim 9, wherein when the selection transistor in the memory block does not turn on by the block selection signal of said memory block, the local line of said memory block is separated from the global line.

11. The semiconductor memory device according to claim 9, wherein the memory array accumulates a plurality of bit data at once, has an electrically erasable and writable memory block and the redundant block.

12. The semiconductor memory device according to claim 9 wherein the semiconductor memory device is an electrically erasable and writable memory.

13. The semiconductor memory device according to claim 9 wherein the semiconductor memory device is used for a data processing system.

14. The semiconductor memory device according to claim 9 wherein the global line is a global word line and the local line is a local word line.

15. The semiconductor memory device according to claim 9 wherein the global line is a global bit line and the local line is a local bit line.

16. The semiconductor memory device according to claim 9 wherein the memory functional unit has the surface which is almost parallel with the surface of the gate insulating film and has a function of retaining a charge.

17. A portable electronic apparatus in which the semiconductor memory device according to claim 9 is incorporated.

18. A semiconductor memory device comprising:
(A) a global line;
(B) a memory array having
  (i) a plurality of local lines,
  (ii) a local decoder connected to the global line and the local lines, and
  (iii) a memory block and a redundant block each constructed by a plurality of memory cells each having a gate electrode formed on a semiconductor layer via a gate insulating film, a channel region disposed below the gate electrode, a diffusion region disposed on both sides of the channel region and having a conductive type opposite to that of the channel region, and a memory functional unit formed on both sides of the gate electrode and having the function of retaining charges,
the memory array having the function that when the local decoder is enabled to be used by a block selection signal, the local decoder decodes an address for connecting a local line selected from the local lines to the global line, and when one of the memory blocks is defective and the local decoder is unusable, the local line is operably disconnected from the global line and the defective block is replaced with the redundant block; and
(C) a circuit for making the local decoder of the defective block unusable and, only when the defective block is addressed, for making the local decoder of the redundant block usable.

19. The semiconductor memory device according to claim 18, wherein the local decoder comprising:
(i) a decoder connecting for receiving the address; and
(ii) the global line or the local line, and a plurality of logic circuits connected each decoders.

20. The semiconductor memory device according to claim 18, wherein the memory array accumulates a plurality of bit data at once, has an electrically erasable and writable memory block and the redundant block.

21. The semiconductor memory device according to claim 18 wherein the semiconductor memory device is an electrically erasable and writable memory.

22. The semiconductor memory device according to claim 18 wherein the semiconductor memory device is used for a data processing system.

23. The semiconductor memory device according to claim 18 wherein the global line is a global word line and the local line is a local word line.

24. The semiconductor memory device according to claim 18 wherein the global line is a global bit line and the local line is a local bit line.

25. The semiconductor memory device according to claim 18 wherein the memory functional unit has the surface which is almost parallel with the surface of the gate insulating film and has a function of retaining a charge.

26. A portable electronic apparatus in which the semiconductor memory device according to claim 18 is incorporated.

* * * * *